United States Patent
Lim

(10) Patent No.: US 6,873,392 B2
(45) Date of Patent: Mar. 29, 2005

(54) ARRAY SUBSTRATE FOR LIQUID CRYSTAL DISPLAY DEVICE AND METHOD OF MANUFACTURING THE SAME

(75) Inventor: Byoung-Ho Lim, Gyeongsangbuk-do (KR)

(73) Assignee: LG. Philips LCD Co., Ltd., Seoul (KR)

(*) Notice: Subject to any disclaimer, the term of this patent is extended or adjusted under 35 U.S.C. 154(b) by 99 days.

(21) Appl. No.: 10/410,400

(22) Filed: Apr. 10, 2003

(65) Prior Publication Data

US 2003/0193623 A1 Oct. 16, 2003

(30) Foreign Application Priority Data

Apr. 16, 2002 (KR) ................................ 10-2002-0020727

(51) Int. Cl.[7] ..................... G02F 1/1333; G02F 1/1343; G02F 1/136
(52) U.S. Cl. .......................... 349/158; 349/54; 349/42; 349/147
(58) Field of Search .......................... 349/158, 42, 54, 349/147

(56) References Cited

U.S. PATENT DOCUMENTS

| | | | | |
|---|---|---|---|---|
| 5,177,577 A | * | 1/1993 | Taniguchi et al. | 257/59 |
| 5,668,032 A | * | 9/1997 | Holmberg et al. | 438/149 |
| 6,020,599 A | * | 2/2000 | Yeo | 257/59 |
| 6,353,464 B1 | * | 3/2002 | Noumi et al. | 349/42 |
| 6,380,559 B1 | * | 4/2002 | Park et al. | 257/59 |
| 6,545,359 B1 | * | 4/2003 | Ohtani et al. | 257/758 |
| 6,636,279 B2 | * | 10/2003 | Takasugi et al. | 349/40 |
| 6,734,925 B1 | * | 5/2004 | Lee et al. | 349/40 |

* cited by examiner

Primary Examiner—Tarifur R. Chowdhury
Assistant Examiner—Mike Qi
(74) Attorney, Agent, or Firm—Morgan Lewis & Bockius LLP

(57) ABSTRACT

An array substrate for a liquid crystal display device includes a plurality of gate lines formed of a first material and a plurality of data lines formed of a second material on a substrate, the plurality of gate lines and the plurality of data lines crossing each other, a plurality of thin film transistors electrically connected to the plurality of gate lines and the plurality of data lines, a plurality of pixel electrodes connected to the plurality of thin film transistors, a plurality of gate pads connected to the plurality of gate lines, a plurality of data pads connected to the plurality of data lines, a first shorting bar electrically connected to odd-numbered gate pads, the first shorting bar made of the first material, a second shorting bar electrically connected to even-numbered gate pads, the second shorting bar made of the second material, a third shorting bar electrically connected to odd-numbered data pads, the third shorting bar made of the first material, a fourth shorting bar electrically connected to even-numbered data pads, the fourth shorting bar made of the second material, first, second, third, and fourth connection lines electrically connected to the first, second, third, and fourth shorting bars, respectively, the first, second, third, and fourth connection lines made of the first material, and first, second, third, and fourth test pads connected to the first, second, third, and fourth connection lines, respectively, the first, second, third, and fourth test pads made of the first material.

15 Claims, 61 Drawing Sheets

ARRAY SUBSTRATE FOR LIQUID CRYSTAL DISPLAY DEVICE AND METHOD OF MANUFACTURING THE SAME

The present invention claims the benefit of Korean Patent Application No. 2002-20727, filed in Korea on Apr. 16, 2002, which is hereby incorporated by reference.

BACKGROUND OF THE INVENTION

1. Field of the Invention

The present invention relates to a liquid crystal display (LCD) device and more particularly, to an array substrate for a liquid crystal display device and a manufacturing method thereof.

2. Discussion of the Related Art

Generally, a liquid crystal display (LCD) device includes two substrates that are spaced apart and face each other with a liquid crystal material layer interposed between the two substrates. Each of the substrates includes electrodes that face each other, wherein a voltage applied to each electrode induces an electric field between the electrodes and within the liquid crystal material layer. Alignment of liquid crystal molecules of the liquid crystal material layer is changed by varying an intensity or direction of the applied electric field. Accordingly, the LCD device displays an image by varying light transmissivity through the liquid crystal material layer in accordance with the arrangement of the liquid crystal molecules.

FIG. 1 is an enlarged perspective view of a liquid crystal display (LCD) device according to the related art. In FIG. 1, an LCD device 7 has upper and lower substrates 5 and 9, which are spaced apart from and facing each other, and a liquid crystal material layer 90 interposed between the upper and lower substrates 5 and 9. The upper substrate 5 includes a black matrix 2, a color filter layer 1, and a transparent common electrode 18 subsequently disposed on an interior surface thereof. The black matrix 2 includes openings having one of three sub-color filters of red (R), green (G), and blue (B).

A gate line 11 and a data line 36 are formed on an interior surface of the lower substrate 9, which is commonly referred to as an array substrate, such that the gate line 11 and the date line 36 cross each other to define a pixel area P. In addition, a thin film transistor T is formed at the crossing of the gate line 11 and the data line 36 and includes a gate electrode, a source electrode, and a drain electrode. A pixel electrode 53 is formed within the pixel area P to correspond to the sub-color filters (R), (G), and (B), and is electrically connected to the thin film transistor T. The pixel electrode 53 is made of a light transparent conductive material, such as indium-tin-oxide (ITO).

A scanning pulse is supplied to the gate electrode of the thin film transistor T along the gate line 11, and a data signal is supplied to the source electrode of the thin film transistor T along the data line 36. Accordingly, light transmission through the liquid crystal material layer 90 is adjusted by controlling electrical and optical properties of the liquid crystal material layer 90. For example, the liquid crystal material layer 90 includes a dielectric anisotropic material having spontaneous polarization properties such that the liquid crystal molecules form a dipole when the electric field is induced. Thus, the liquid crystal molecules of the liquid crystal material layer 90 are controlled by the applied electric field. In addition, optical modulation of the liquid crystal material layer 90 is adjusted according to the arrangement of the liquid crystal molecules. Therefore, images of the LCD device are produced by controlling light transmittance of the liquid crystal material layer 90 due to optical modulation of the liquid crystal material layer 90.

FIG. 2 is a plan view of an array substrate for an LCD device according to the related art, FIG. 3 is an enlarged plan view of region "A" of FIG. 2 according to the related art, FIG. 4 is an enlarged plan view of region "B" of FIG. 2 according to the related art, and FIG. 5 is an enlarged plan view of region "C" of FIG. 2 according to the related art.

In FIG. 2, gate lines 11 and data lines 36 are formed on a substrate 9 to cross each other, thereby defining pixel areas P. A thin film transistor T (in FIG. 5) is formed at the crossing of each of the gate and data lines 11 and 36 to function as a switching element. The thin film transistor T includes a gate electrode 13 that is connected to the gate line 11 to receive scanning signals, a source electrode 33 is connected to the data line 36 and receives data signals, and a drain electrode 35 is spaced apart from the source electrode 33. In addition, the thin film transistor T includes an active layer 49 between the gate electrode 13 and the source and drain electrodes 33 and 35, and a transparent pixel electrode 53 is formed in the pixel area P and is connected to the drain electrode 35.

In FIG. 3, a gate pad 15 is formed at one end of the gate line 11, and a gate pad terminal 60 overlaps the gate pad 15. The gate pad terminal 60 may be formed of the same material as the pixel electrode 53. The gate pad 15 includes odd and even gate pads 15a and 15b, wherein the odd gate pad 15a is connected to a first shorting bar 17 and the even gate pad 15b is connected to a second shorting bar 37.

In FIG. 4, a data pad 38 is formed at one end of the data line 36, and a data pad terminal 62 overlaps the data pad 38. The data pad terminal 62 may be formed of the same material as the pixel electrode 53. The data pad 38 also includes odd and even data pads 38a and 38b, wherein the odd data pad 38a is connected to a third shorting bar 19 and the even data pad 38b is connected to a fourth shorting bar 39.

In FIGS. 3 and 4, the first to fourth shorting bars 17, 37, 19, and 39 are electrically connected to first, second, third, and fourth test pads 21, 41, 23 and 43 (in FIG. 2) through first, second, third, and fourth connecting lines 20, 45, 25 and 47 (in FIG. 2), respectively. The first, second, third, and fourth test pads 21, 41, 23, and 43 are formed along a line on a portion of the substrate 9. The first and third shorting bars 17 and 19 are made of the same material as the gate line 11, and the second and fourth shorting bars 37 and 39 are formed of the same material as the data line 36. Furthermore, the first and third test pads 21 and 23 are made of the same material as the gate line 11, and the first and third connecting lines 20 and 25 are formed of the same material as the data line 36. Accordingly, the even gate pad 15b is electrically connected to the second shorting bar 37 through the gate pad terminal 60, and the even data pad 38b is electrically connected to the fourth shorting bar 39 through the data pad terminal 62. In addition, the shorting bars 17, 37, 19, and 39 are removed by cutting the substrate 9 after the testing process of the array substrate.

FIGS. 6A to 6F are cross sectional views of a manufacturing method of the array substrate using four masks along VI—VI of FIG. 5 according to the related art, and FIGS. 7A to 7F are cross sectional views of a manufacturing method of the array substrate using four masks along VII—VII of FIG. 2 according to the related art.

In FIGS. 6A and 7A, a gate electrode 13 is formed on a substrate 9 by depositing a first metal layer, and patterning the first metal layer through a first mask process. In addition, a gate line 11 (in FIG. 5) and a gate pad 15 (in FIG. 3) are also formed on the substrate 9. Next, a gate insulating layer 29, an amorphous silicon layer 30, a doped amorphous silicon layer 31, and a second metal layer 32 are subsequently deposited on the substrate 9 and the gate electrode 13. In addition, a photoresist layer 70 is formed on the second metal layer 32 by coating a photoresist material. The gate insulating layer 29 is made of an inorganic insulating material, such as silicon nitride (SiNx) and silicon oxide (SiO2), and the second metal layer 32 may be formed of chromium (Cr) or molybdenum (Mo).

In FIGS. 6B and 7B, a mask 80 includes a blocking portion M1, a half transmitting portion M2, and a transmitting portion M3 that are disposed over the photoresist layer 70, wherein the blocking portion M1 corresponds to a source drain region D and the half transmitting portion M2 corresponds to a channel region E. The photoresist layer 70 may be a positive type, wherein a portion exposed to light is developed and removed. Subsequently, the photoresist layer 70 is exposed to light such that the portion of the photoresist layer 70 corresponding to the half transmitting portion M2 is exposed to the light in an amount less than the photoresist layer 70 corresponding to the transmitting portion M3. The half transmitting portion M2 may include slits or semitransparent layer.

In FIGS. 6C and 7C, the exposed photoresist layer 70 (in FIGS. 6B and 7B) is developed, whereby a photoresist pattern 72 having different thicknesses is formed. A first thickness photoresist pattern 72a corresponds to the blocking portion M1 (in FIGS. 6B and 7B) and a second thickness photoresist pattern 72b, which is thinner than the first thickness 72a, corresponds to the half transmitting portion M2 (in FIG. 6B). In addition, there is no photoresist pattern in a region corresponding to the transmitting portion M3 (in FIGS. 6B and 7B).

In FIGS. 6D and 7D, the second metal layer 32, the doped amorphous silicon layer 31, and the amorphous silicon layer 30 (of FIGS. 6C and 7C) that have been exposed by the photoresist pattern 72 are patterned, and the photoresist pattern 72 is removed. Thus, source and drain electrodes 33 and 35, an ohmic contact layer 51, an active layer 49, and a fourth connecting line 47 (also in FIG. 2) are formed through a second mask process using the mask 80 (in FIGS. 6B and 7B). Accordingly, in FIG. 7D, an amorphous silicon pattern 30a and a doped amorphous silicon pattern 31a are also formed under the fourth connecting line 47.

In FIGS. 6E and 7E, a passivation layer 56 is formed on the source and drain electrodes 33 and 35 and the fourth connecting line 47 by coating a transparent organic material, such as benzocyclobutene (BCB) and an acrylic resin, or by depositing an inorganic material, such as silicon nitride (SiNx) and silicon oxide (SiO$_2$). Next, in FIG. 6E, the passivation layer 56 is patterned through a third mask process, thereby forming a drain contact hole 58 that exposes a portion of the drain electrode 35.

In FIG. 6F, a pixel electrode 53 is formed on the passivation layer 56 by depositing a transparent conductive material, such as indium-tin-oxide (ITO) and indium-zinc-oxide (IZO), and patterning the transparent conductive material through a fourth mask process. The pixel electrode 53 is connected to the drain electrode 35 via the drain contact hole 58.

Alternatively, the second mask process progresses differently depending on a material of the second metal layer 32 (in FIGS. 6C and 7C), such as chromium and molybdenum.

The second mask process according to the chromium material will be described hereinafter with reference to figures.

FIGS. 8A to 8C are cross sectional views of a second mask process of the array substrate along VI—VI of FIG. 5 according to the related art, and FIGS. 9A to 9C are cross sectional views of a second mask process of the array substrate along VII—VII of FIG. 2 according to the related art.

In FIGS. 8A and 9A, the second metal layer 32, the doped amorphous silicon layer 31, and the amorphous silicon layer 30 (in FIGS. 6C and 7C) that have been exposed by the photoresist pattern 72 (in FIGS. 6C and 7C) are removed. The second metal layer 32 (in FIGS. 6C and 7C) that is made of chromium is etched by a wet etching method, and the doped amorphous silicon layer 31 and the amorphous silicon layer 30 (in FIGS. 6C and 7C) are patterned by a dry etching method. Thus, a source and drain pattern 32a, a doped amorphous silicon pattern 51a, an active layer 49, and a fourth connecting line 47 are formed. Next, the second thickness photoresist pattern 72b (in FIG. 6C) corresponding to the channel region "E" is removed through an ashing process, whereby exposing a portion of the source and drain pattern 32a. Accordingly, the first thickness photoresist pattern 72a is partially removed, thereby reducing the thickness of the first thickness photoresist pattern 72a.

In FIGS. 8B and 9B, the source and drain pattern 32a (in FIG. 8A) is wet-etched by using the first thickness photoresist pattern 72a as an etching mask. Accordingly, in FIG. 8B, source and drain electrodes 33 and 35 are formed, and a portion of the doped amorphous silicon pattern 51a is exposed.

In FIGS. 8C and 9C, the doped amorphous silicon pattern 51a (in FIG. 8B) that is exposed by the source and drain electrodes 33 and 35 is dry-etched. Thus, an ohmic contact layer 51 is formed. In addition, in FIGS. 6D and 7D, the remaining photoresist pattern 72a (in FIGS. 8C and 9C) is removed. Thus, if the second metal layer 32 (of FIGS. 6C and 7C) is made of chromium, the second mask process is composed of a first wet-etch step, a first dry-etch step, a second wet-etch step, and a second dry-etch step. Accordingly, total manufacturing time increases.

Alternatively, the second metal layer 32 (in FIGS. 6C and 7C) may be formed of molybdenum, and can be dry-etched. The second mask process according to the molybdenum material will be described hereinafter with reference to figures.

FIGS. 10A and 10B are cross section views of another second mask process of the array substrate along VI—VI of FIG. 5 according to the related art, and FIGS. 11A and 11B are cross sectional views of another second mask process of the array substrate along VII—VII of FIG. 2 according to the related art.

In FIGS. 10A and 11A, the second metal layer 32, the doped amorphous silicon layer 31, and the amorphous silicon layer 30 (in FIGS. 6C and 7C) that have been exposed by the photoresist pattern 72 (in FIGS. 6C and 7C) are removed by a dry-etching method, wherein the second metal layer 32 is made of molybdenum. Thus, a source and drain pattern 32a, a doped amorphous silicon pattern 51a, an active layer 49, and a fourth connecting line 47 are formed. Next, the second thickness photoresist pattern 72b (in FIG. 6C) is removed through an ashing process, whereby exposing a portion of the source and drain pattern 32a corresponding to the channel region "E." At this time, the first thickness photoresist pattern 72a is partially removed, whereby the thickness of the first thickness photoresist pattern 72a is reduced.

In FIGS. 10B and 11B, the source and drain pattern 32a (in FIG. 10A) and the doped amorphous silicon layer 31a are dry-etched by using the first thickness photoresist pattern 72a as an etching mask at a time. Accordingly, source and drain electrodes 33 and 35 and an ohmic contact layer 51 are formed, and a portion of the active layer 49 is exposed. As shown in FIGS. 6D and 7D, the remained photoresist pattern 72a (of FIGS. 10B and 11B) is then removed.

However, during the ashing process, the photoresist layer in an outer area on the substrate 9, that is, the photoresist pattern 72a corresponding to the fourth connecting line 47 (in FIG. 11A) is removed at a rate faster than the photoresist pattern 72a on the source and drain pattern 32a (in FIG. 10A). In addition, as shown in FIG. 11B, a part of the fourth connecting line 47 is unintentionally removed. If molybdenum is used as the second metal layer 32 (in FIGS. 6C and 7C), manufacturing time can be reduced, but testing lines, such as shorting bars and connecting lines, may be disconnected.

SUMMARY OF THE INVENTION

Accordingly, the present invention is directed to an array substrate for a liquid crystal display device and a manufacturing method thereof that substantially obviates one or more problems due to limitations and disadvantages of the related art.

An advantage of the present invention is to provide an array substrate for a liquid crystal display device and a manufacturing method thereof that prevents signal disconnection.

Another object of the present invention is to provide an array substrate for a liquid crystal display device and a manufacturing method thereof that shorten manufacturing time.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an array substrate for a liquid crystal display device includes a substrate, a plurality of gate lines formed of a first material and a plurality of data lines formed of a second material on the substrate, the plurality of gate lines and the plurality of data lines crossing each other, a plurality of thin film transistors electrically connected to the plurality of gate lines and the plurality of data lines, a plurality of pixel electrodes connected to the plurality of thin film transistors, a plurality of odd-numbered and even-numbered gate pads connected to the plurality of gate lines, a plurality of odd-numbered and even-numbered data pads connected to the plurality of data lines, a first shorting bar electrically connected to each of the odd-numbered gate pads, the first shorting bar made of the first material, a second shorting bar electrically connected to each of the even-numbered gate pads, the second shorting bar made of the second material, a third shorting bar electrically connected to each of the odd-numbered data pads, the third shorting bar made of the first material, a fourth shorting bar electrically connected to each of the even-numbered data pads, the fourth shorting bar made of the second material, first, second, third, and fourth connection lines electrically connected to the first, second, third, and fourth shorting bars, respectively, the first, second, third, and fourth connection lines made of the first material, and first, second, third, and fourth test pads connected to the first, second, third, and fourth connection lines, respectively, the first, second, third, and fourth test pads made of the first material.

In another aspect, a manufacturing method of an array substrate for a liquid crystal display device includes forming a plurality of gate lines, a plurality of gate electrodes, and a plurality of odd-numbered and even-numbered gate pads on a substrate, forming a gate insulating layer on the plurality of gate lines, the plurality of gate electrodes and the plurality of odd-numbered and even-numbered gate pads, forming a plurality of active layers on the gate insulating layer, forming a plurality of ohmic contact layers on the plurality of active layers, forming a plurality of data lines, a plurality of odd-numbered and even-numbered data pads, a plurality of source electrodes, and a plurality of drain electrodes on the plurality of ohmic contact layers, forming a first shorting bar electrically connected to each of the odd-numbered gate pads, forming a second shorting bar electrically connected to each of the even-numbered gate pads, forming a third shorting bar electrically connected to each of the odd-numbered data pads, forming a fourth shorting bar electrically connected to each of the even-numbered data pads, forming first, second, third, and fourth connection lines electrically connected to the first, second, third, and fourth shorting bars, respectively, forming first, second, third, and fourth test pads connected to the first, second, third, and fourth connection lines, respectively, forming a passivation layer on the plurality of data lines, the plurality of odd-numbered and even-numbered data pads, the plurality of source electrodes, and the plurality of drain electrodes, and forming a plurality of pixel electrodes on the passivation layer, wherein the steps of forming the first shorting bar, the third shorting bar, the first, second, third, and fourth connection lines, and the first, second, third, and fourth test pads are simultaneously performed with the steps of forming the plurality of gate lines, the plurality of gate electrodes, and the plurality of odd-numbered and even-numbered gate pads, and wherein the steps of forming the second shorting bar and the fourth shorting bar are simultaneously performed with the step of forming the plurality of data lines, the plurality of odd-numbered and even-numbered data pads, the plurality of source electrodes, and the plurality of drain electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the illustrated embodiments of the present invention, which are illustrated in the accompanying drawings.

Figure 1:
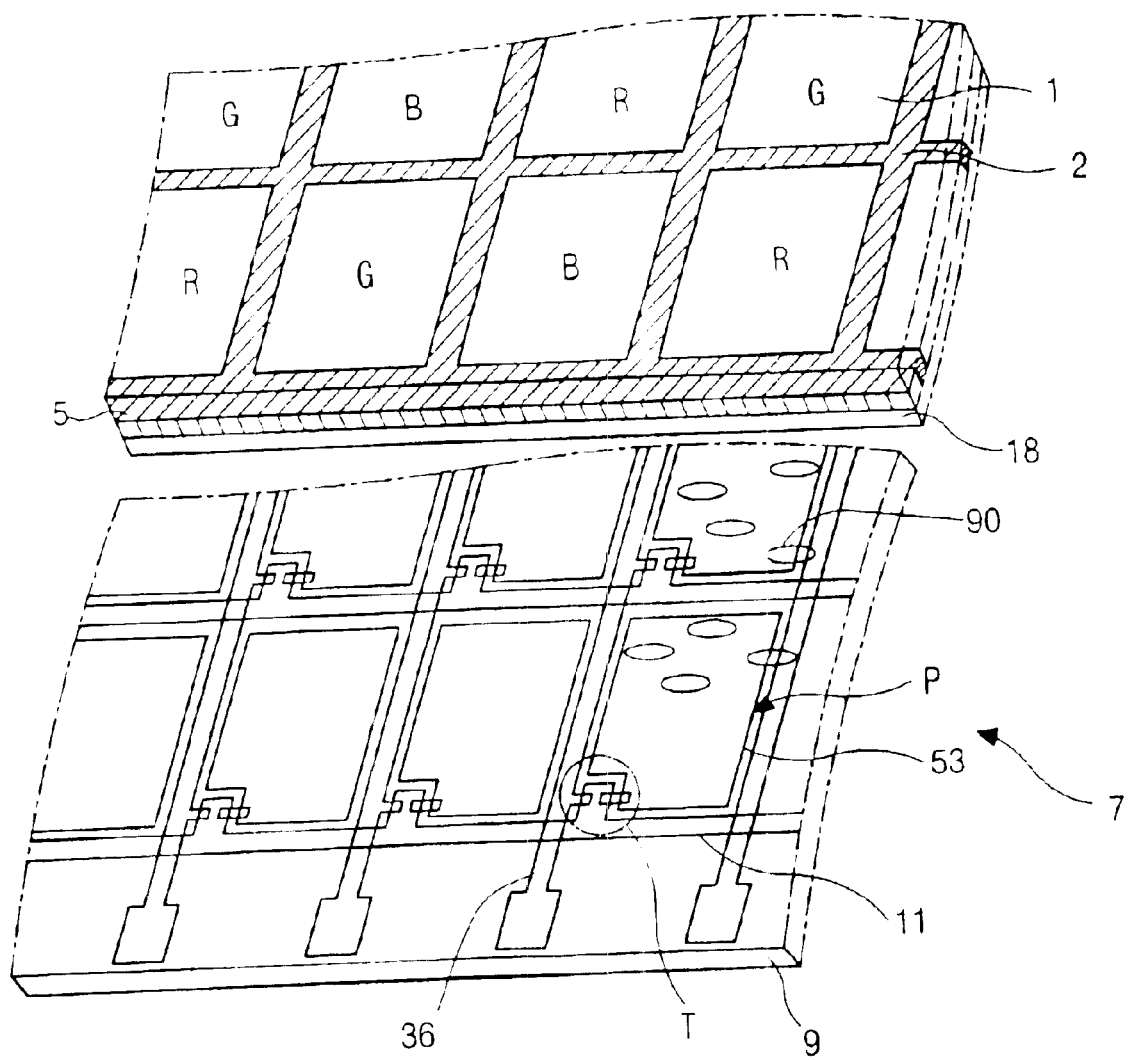
FIG. 1 is an enlarged perspective view of a liquid crystal display (LCD) device according to the related art.
Figure 2:
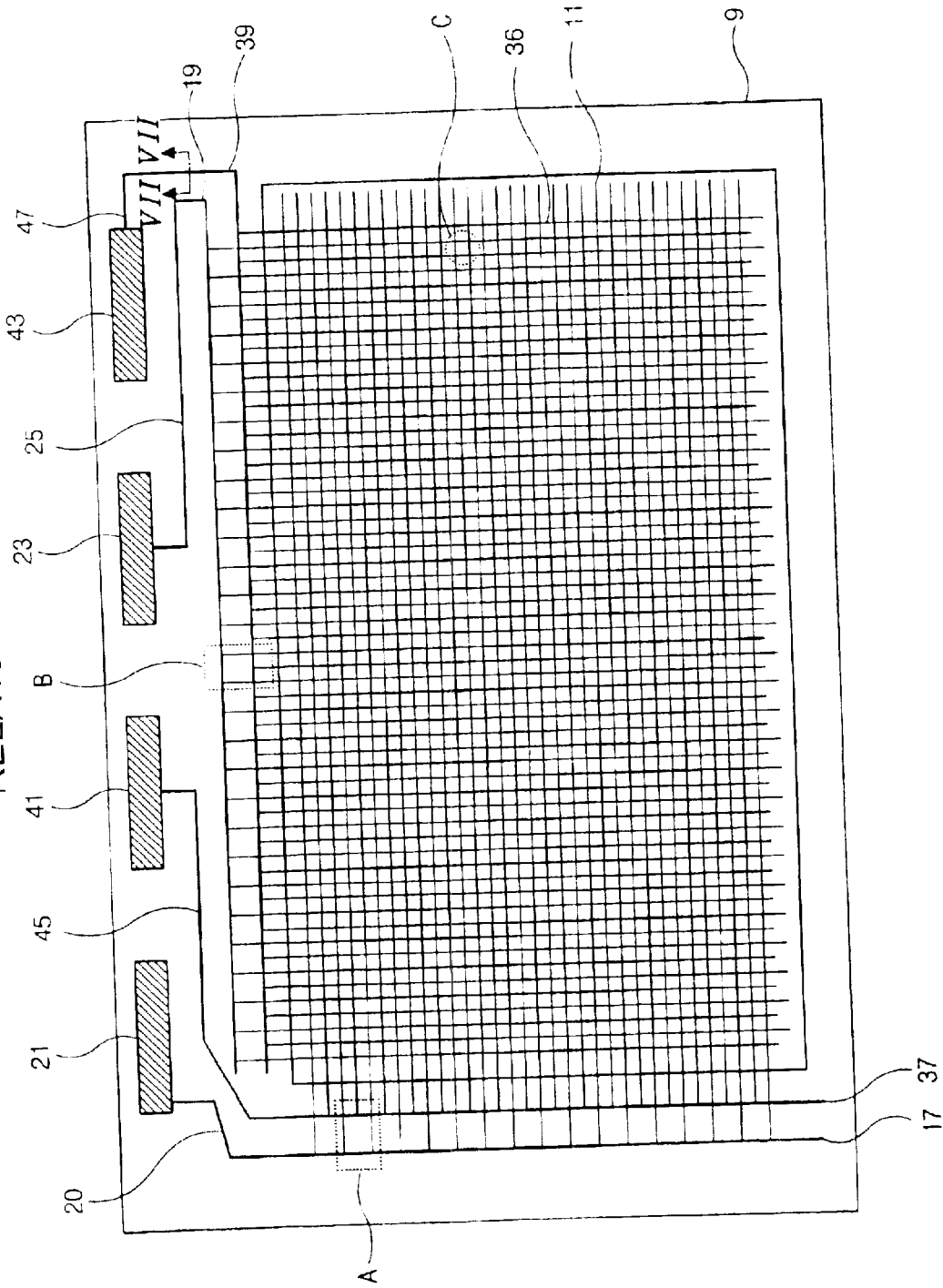
FIG. 2 is a plan view of an array substrate for an LCD device according to the related art.
Figure 3:
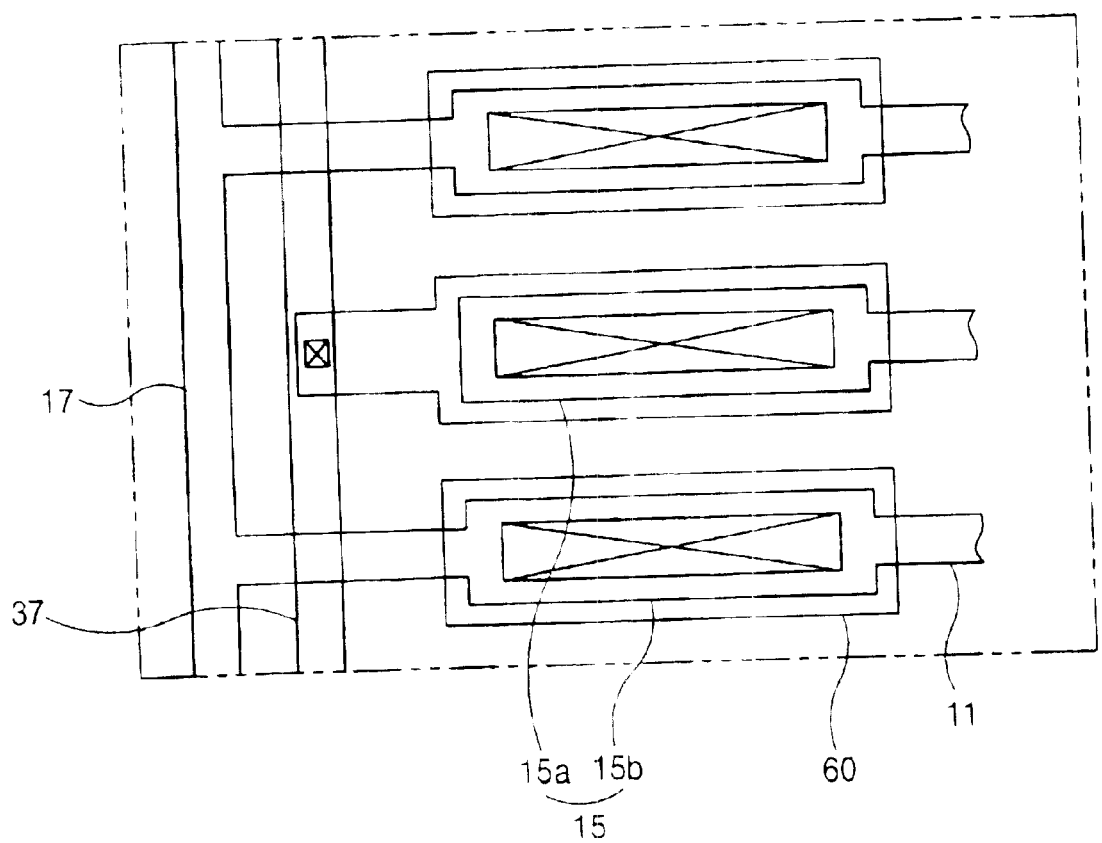
FIG. 3 is an enlarged plan view of region "A" of FIG. 2 according to the related art.
Figure 4:
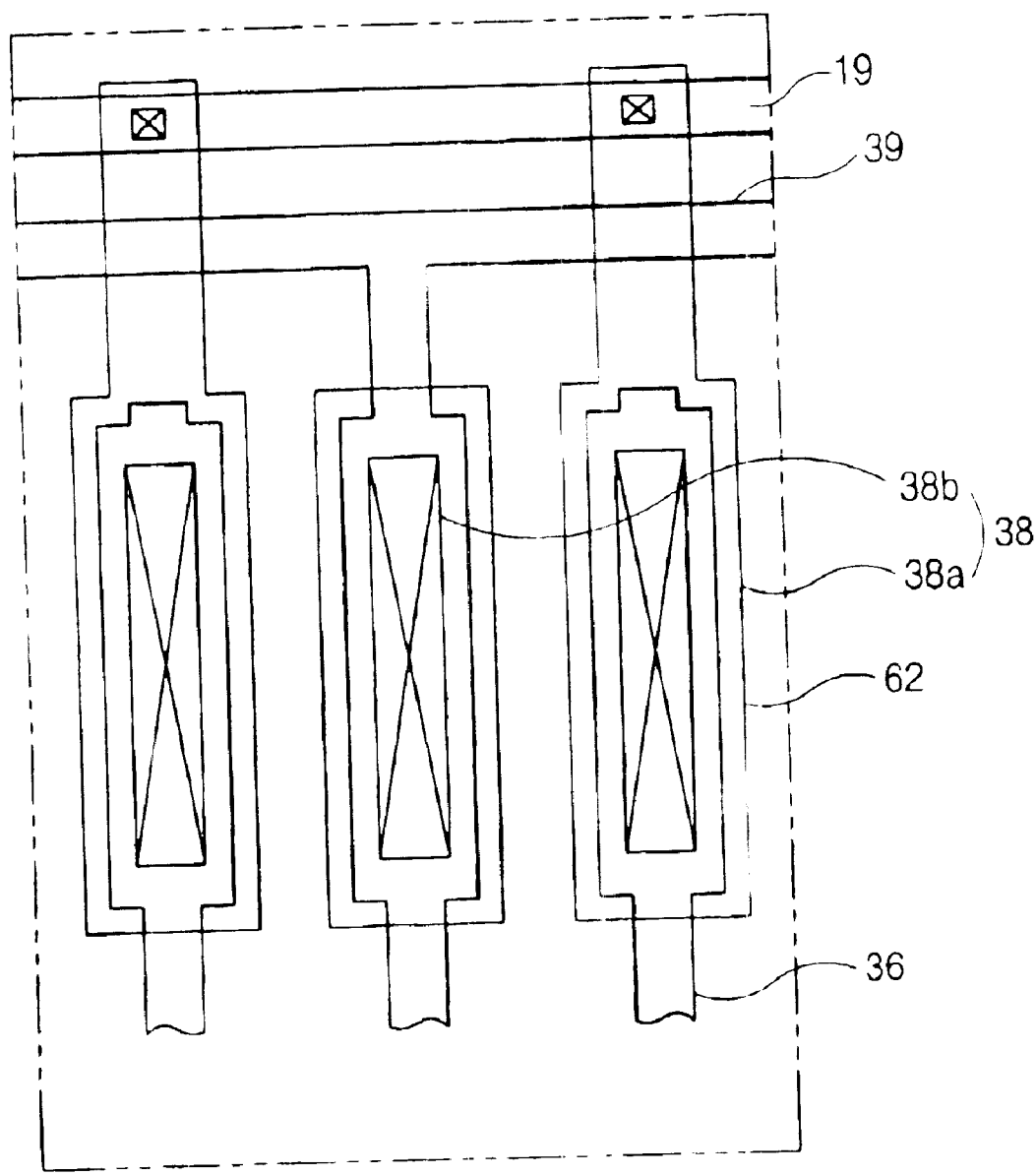
FIG. 4 is an enlarged plan view of region "B" of FIG. 2 according to the related art.
Figure 5:
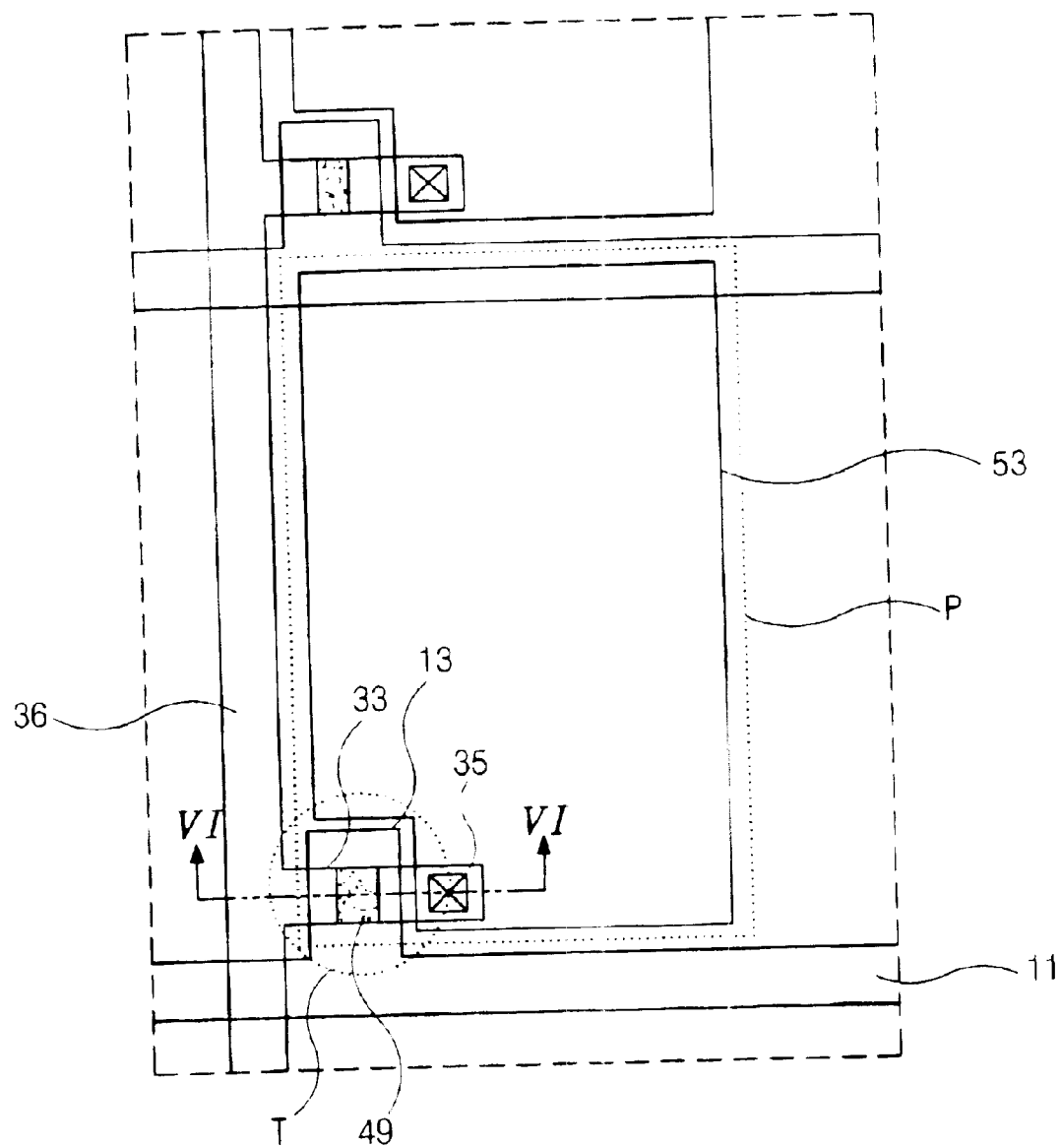
FIG. 5 is an enlarged plan view of region "C" of FIG. 2 according to the related art.
Figure 6A:
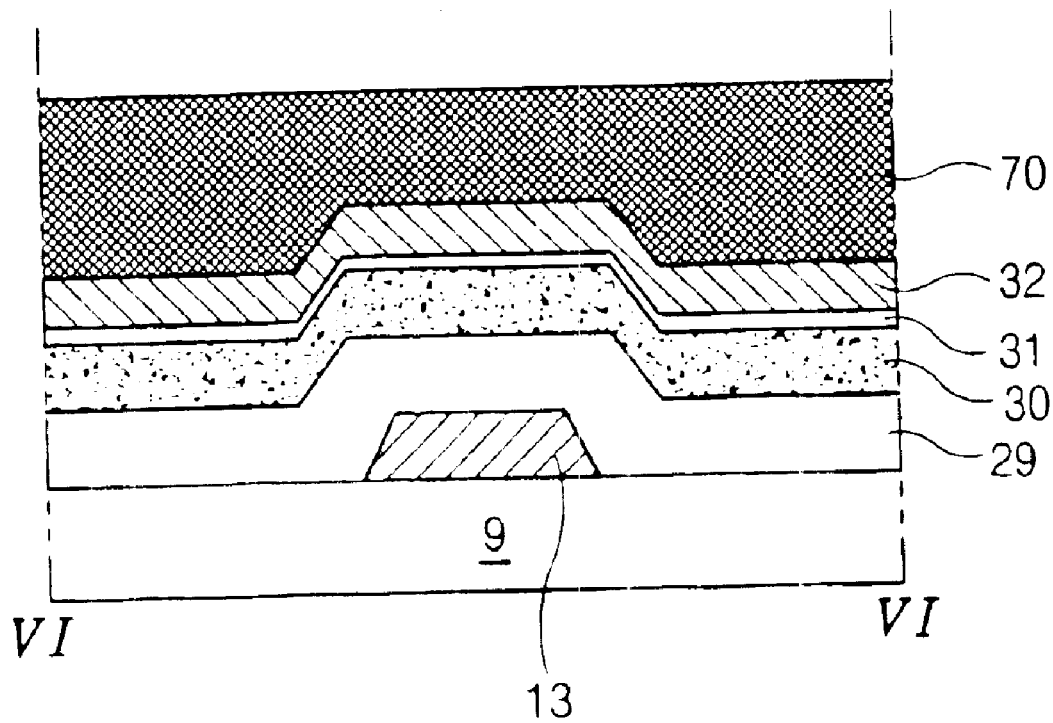
FIGS. 6A to 6F are cross sectional views of a manufacturing method of the array substrate using four masks along VI—VI of FIG. 5 according to the related art.
Figure 6B:
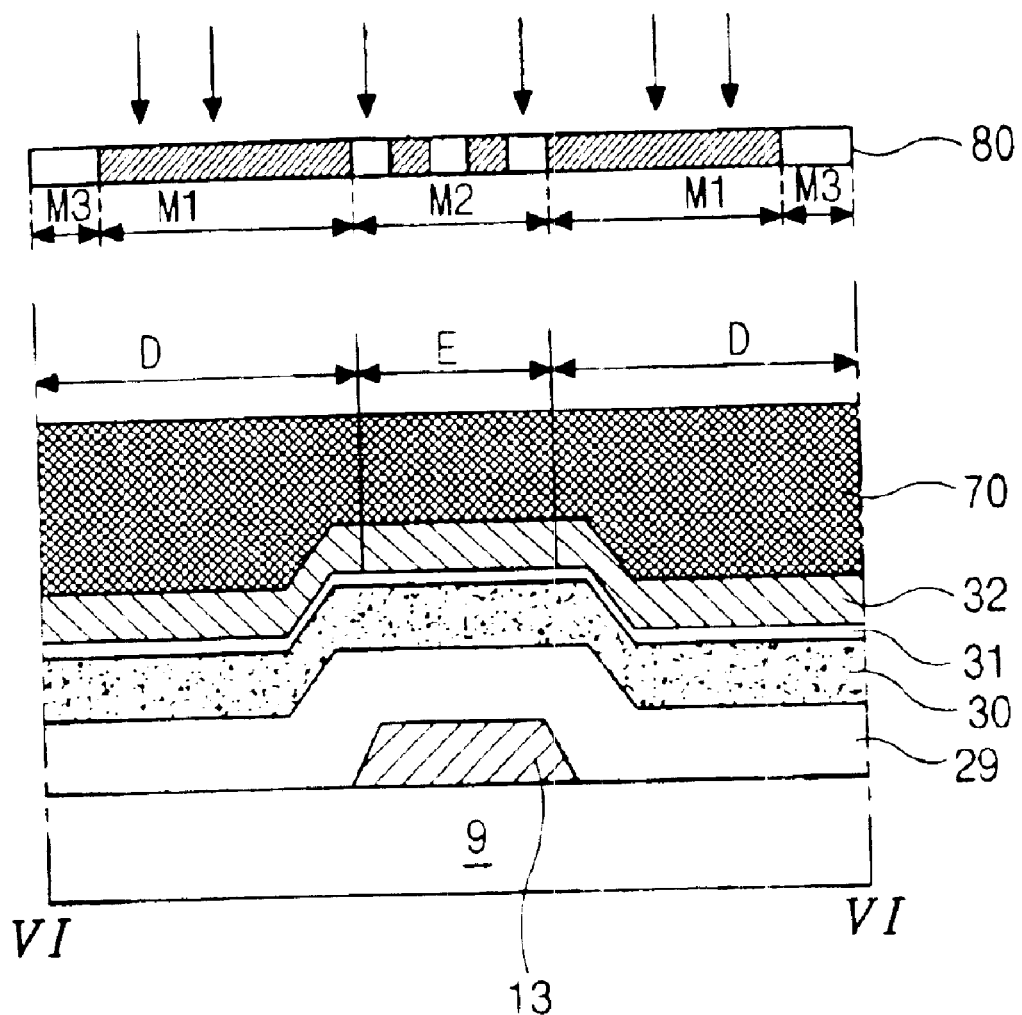
Figure 6C:
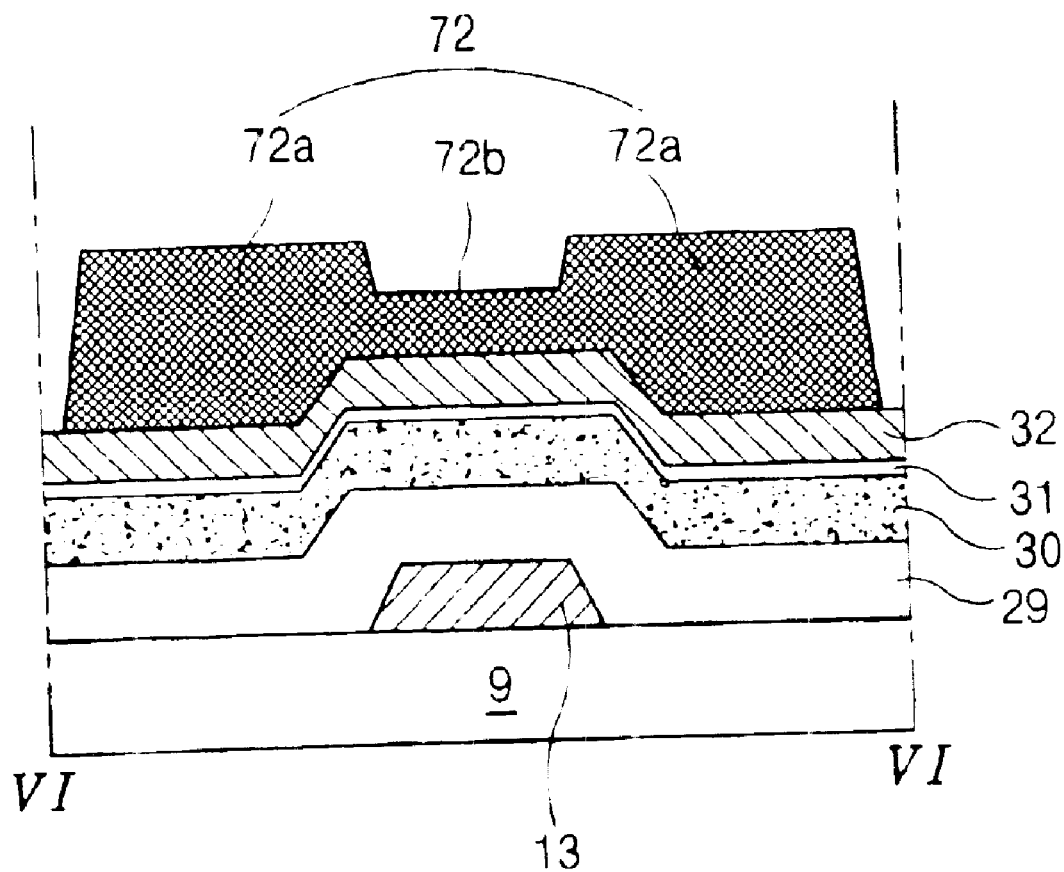
Figure 6D:
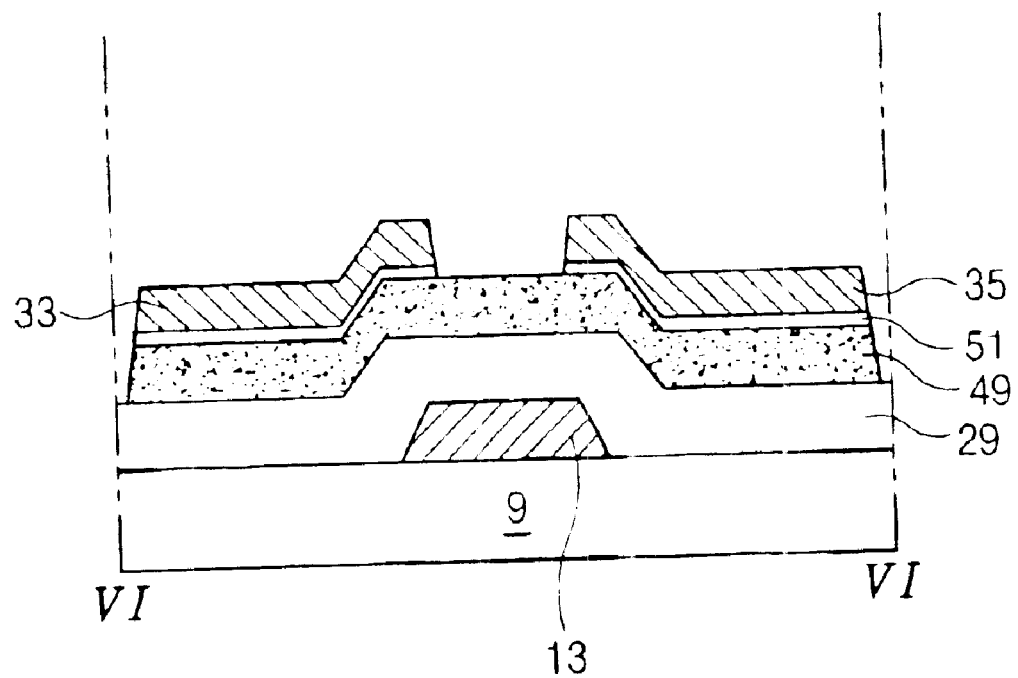
Figure 6E:
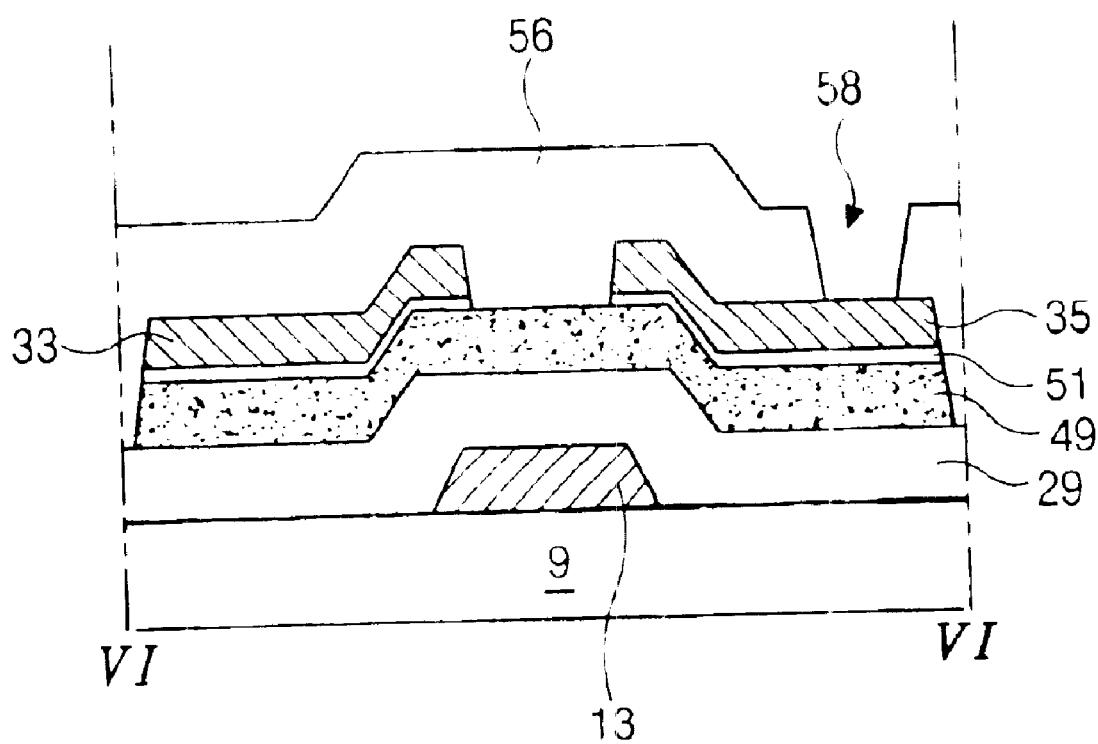
Figure 6F:
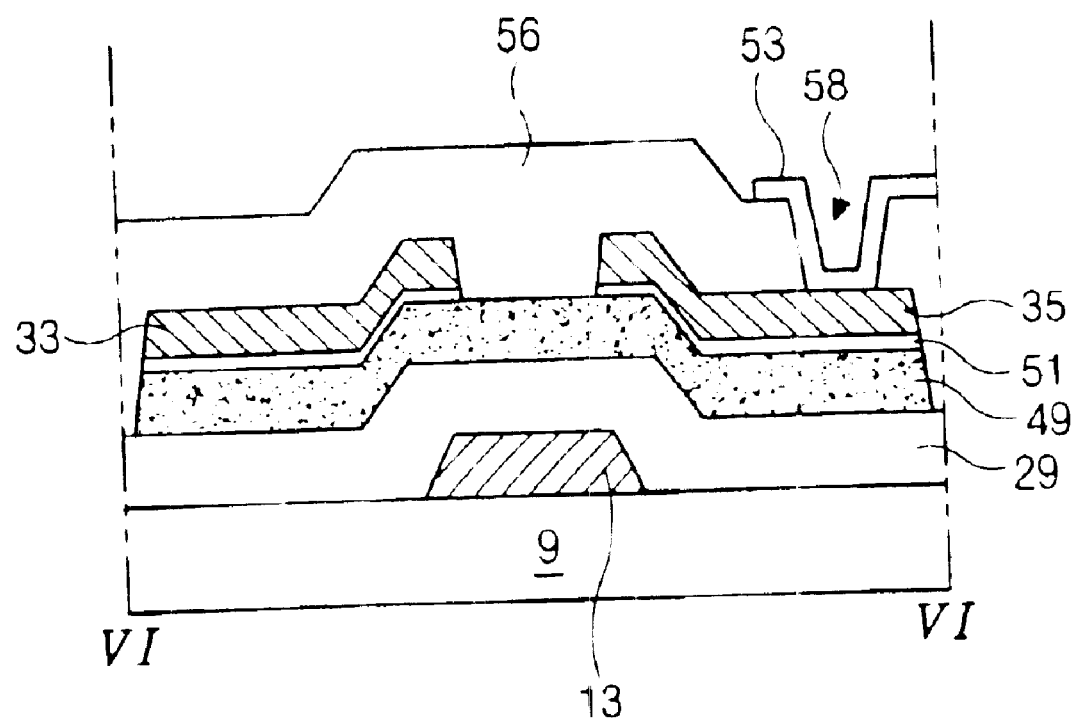
Figure 7A:
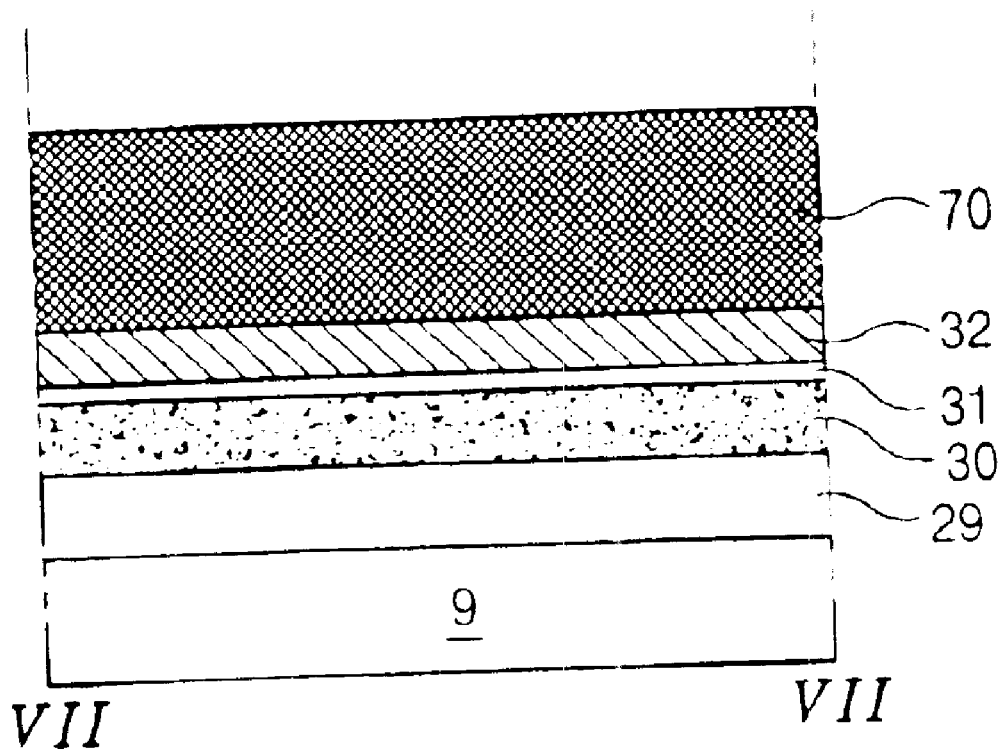
FIGS. 7A to 7F are cross sectional views of a manufacturing method of the array substrate using four masks along VII—VII of FIG. 2 according to the related art.
Figure 7B:
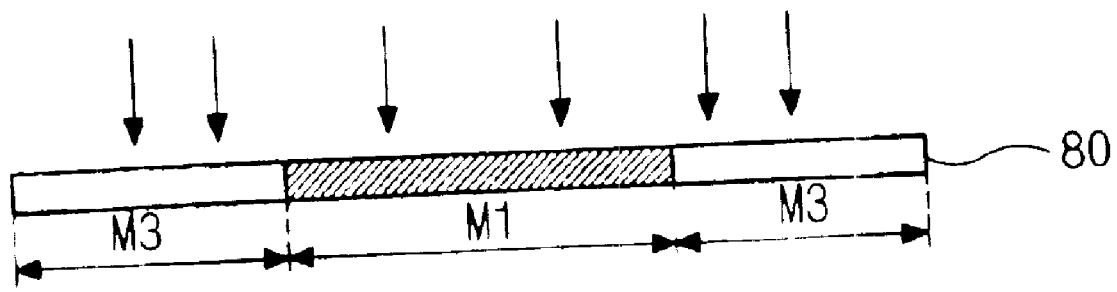
Figure 7B:
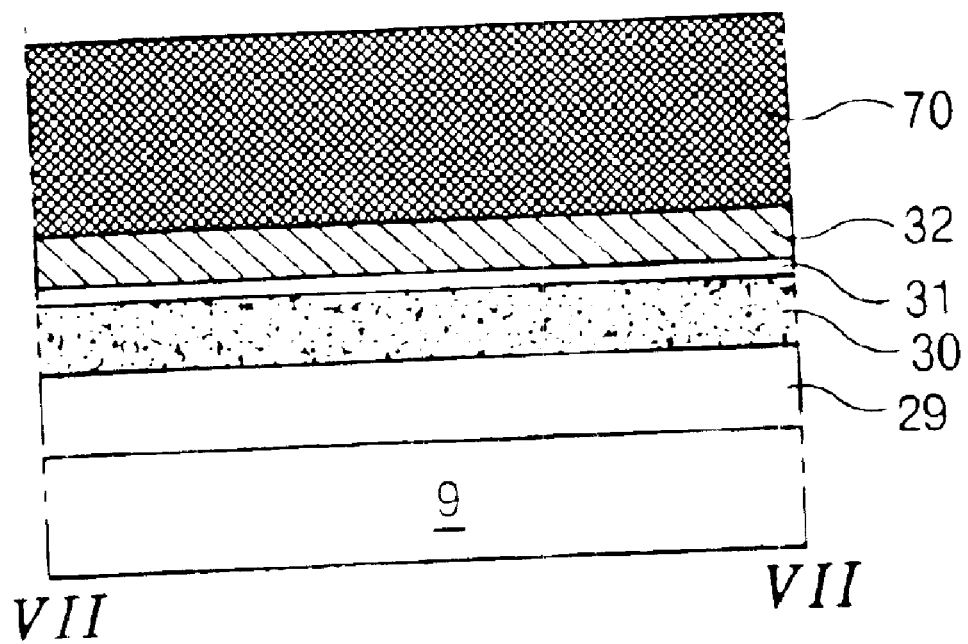
Figure 7C:
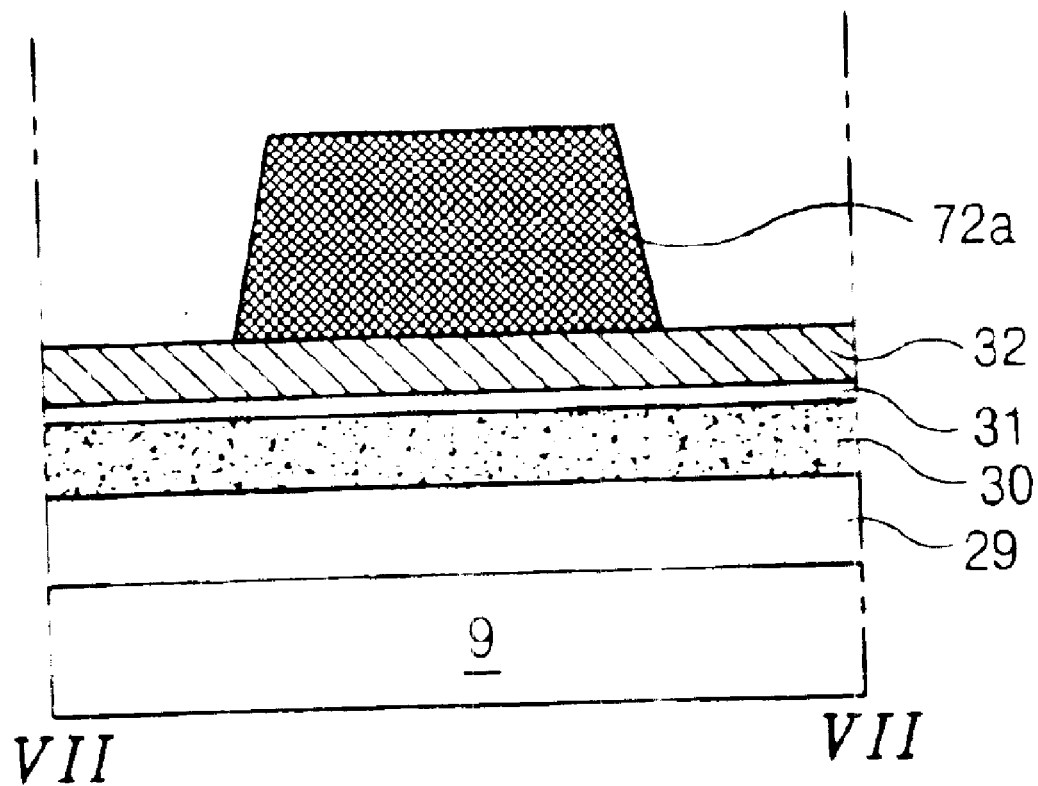
Figure 7D:
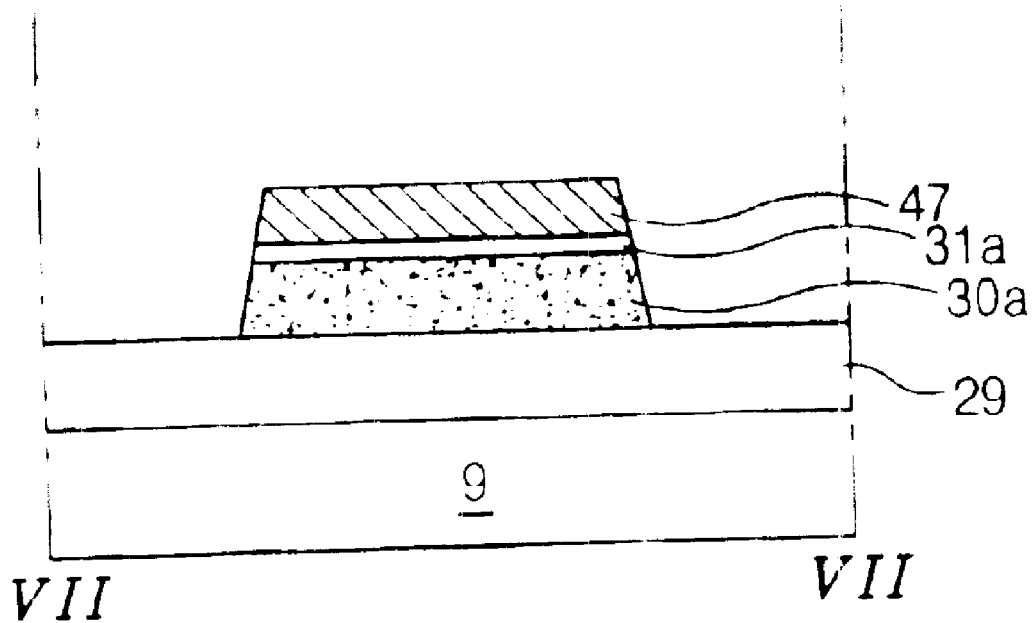
Figure 7E:
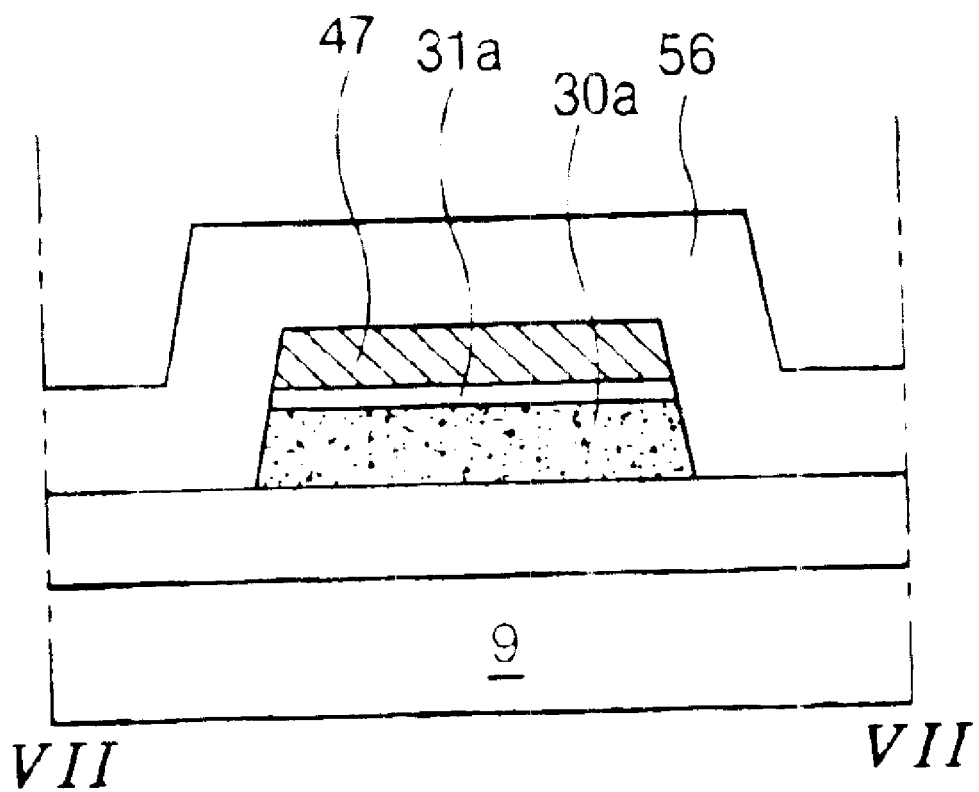
Figure 7F:
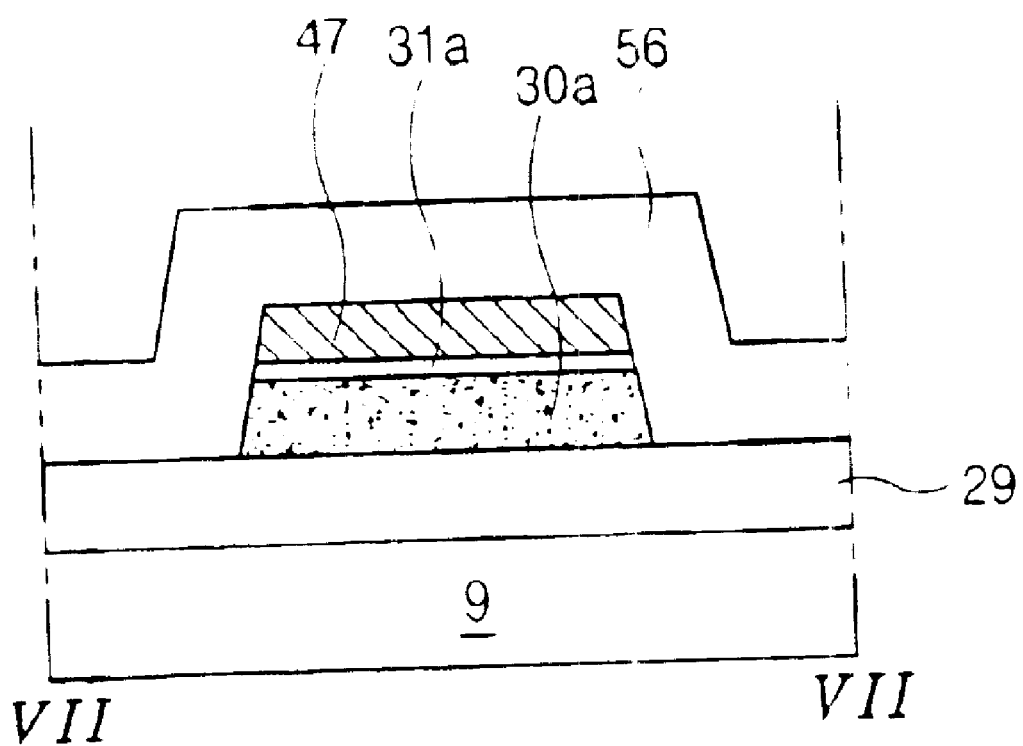
Figure 8A:
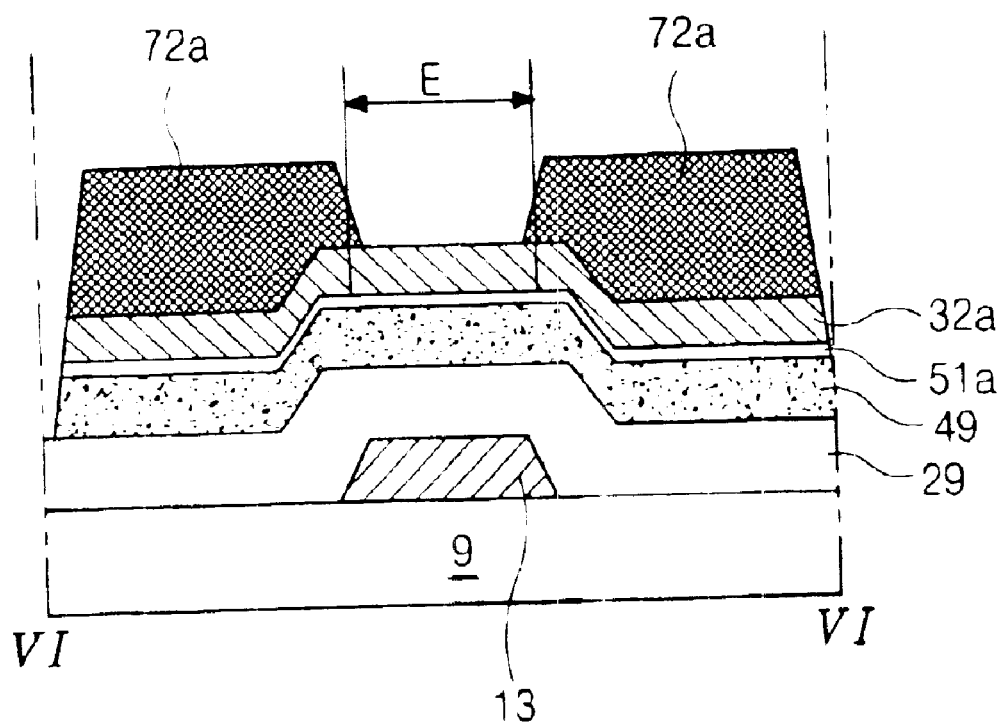
FIGS. 8A to 8C are cross sectional views of a second mask process of the array substrate along VI—VI of FIG. 5 according to the related art.
Figure 8B:
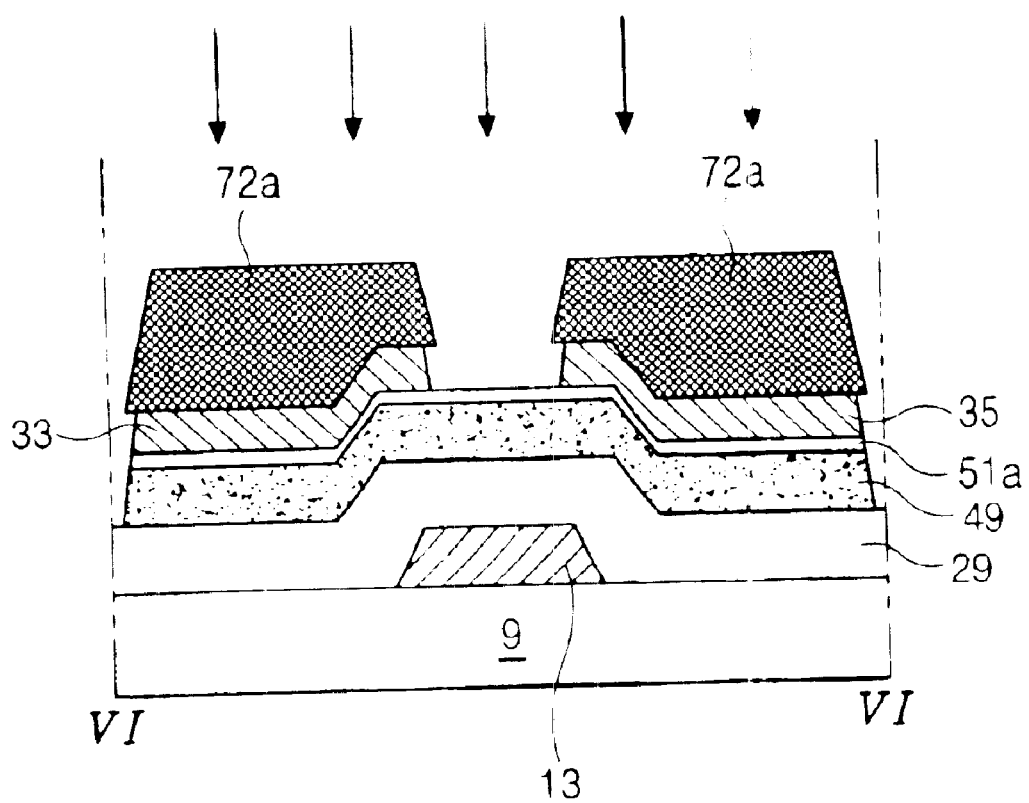
Figure 8C:
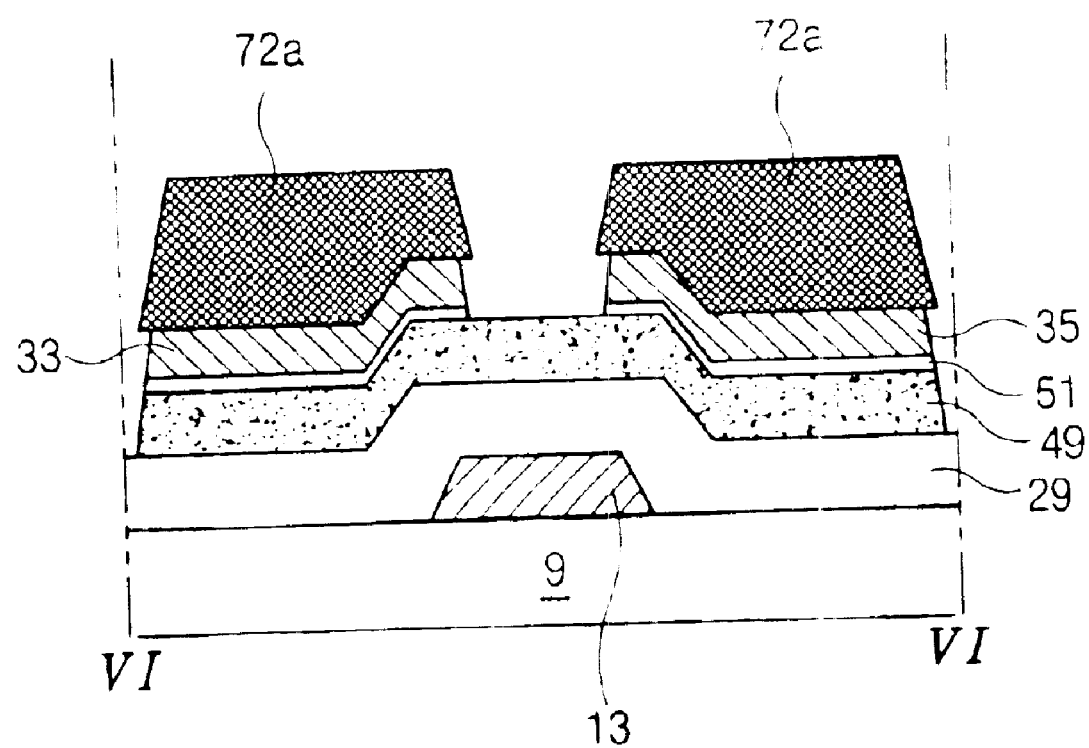
Figure 9A:
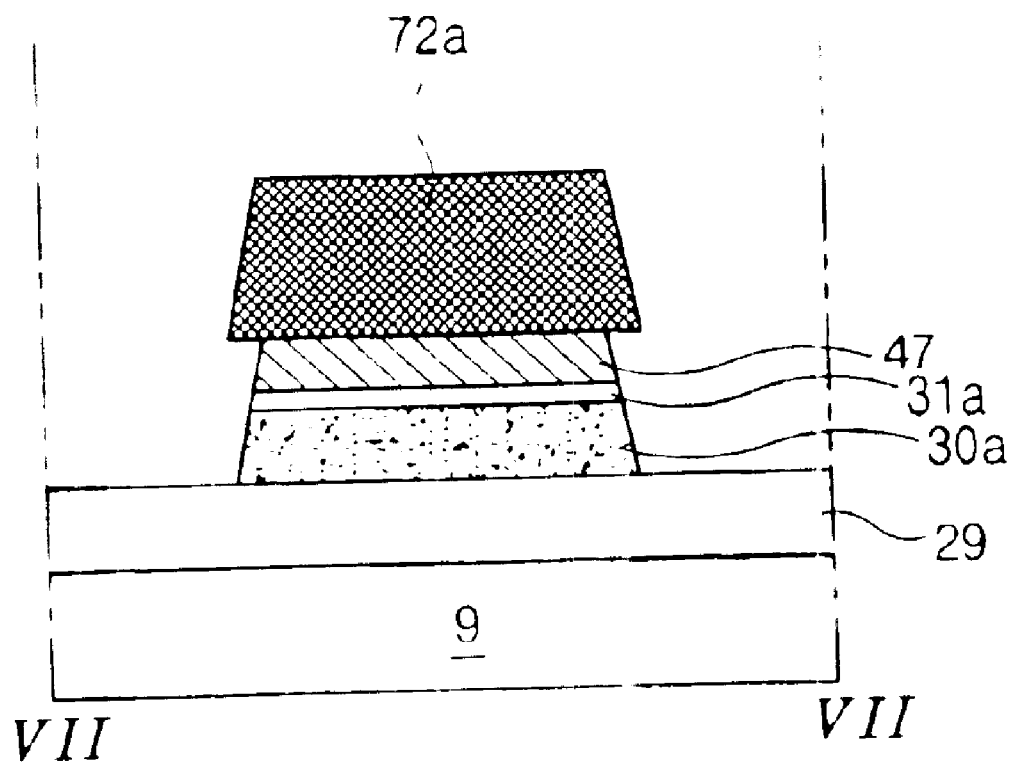
FIGS. 9A to 9C are cross sectional views of a second mask process of the array substrate along VII—VII of FIG. 2 according to the related art.
Figure 9B:
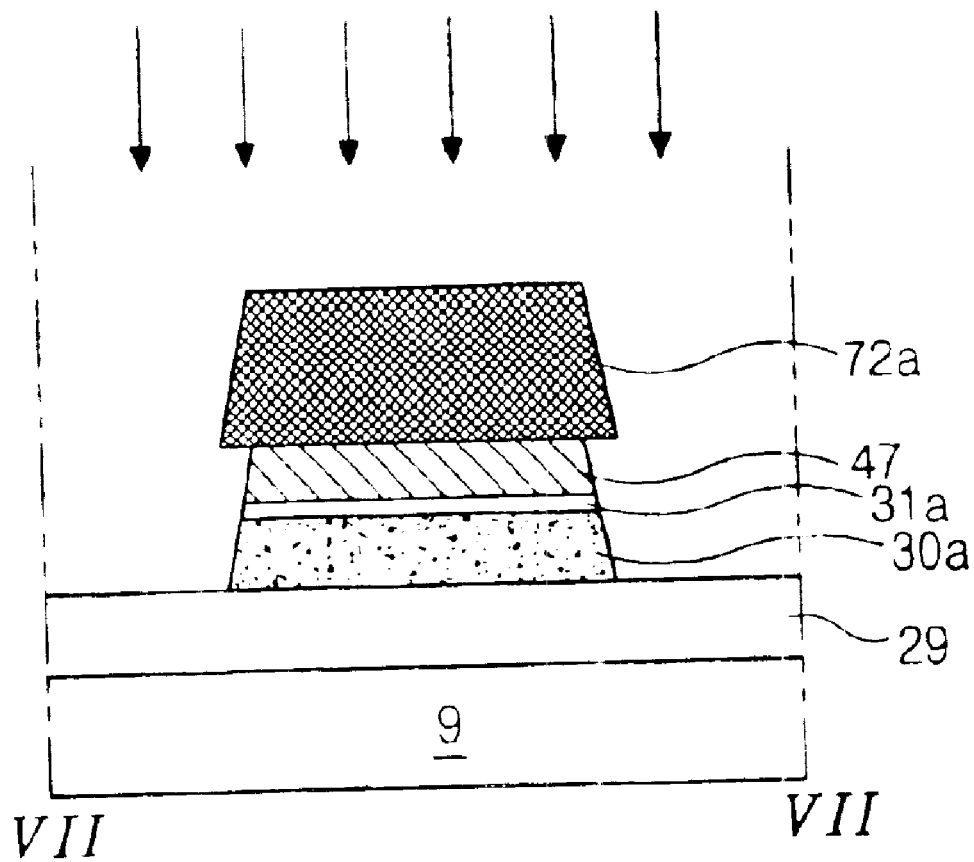
Figure 9C:
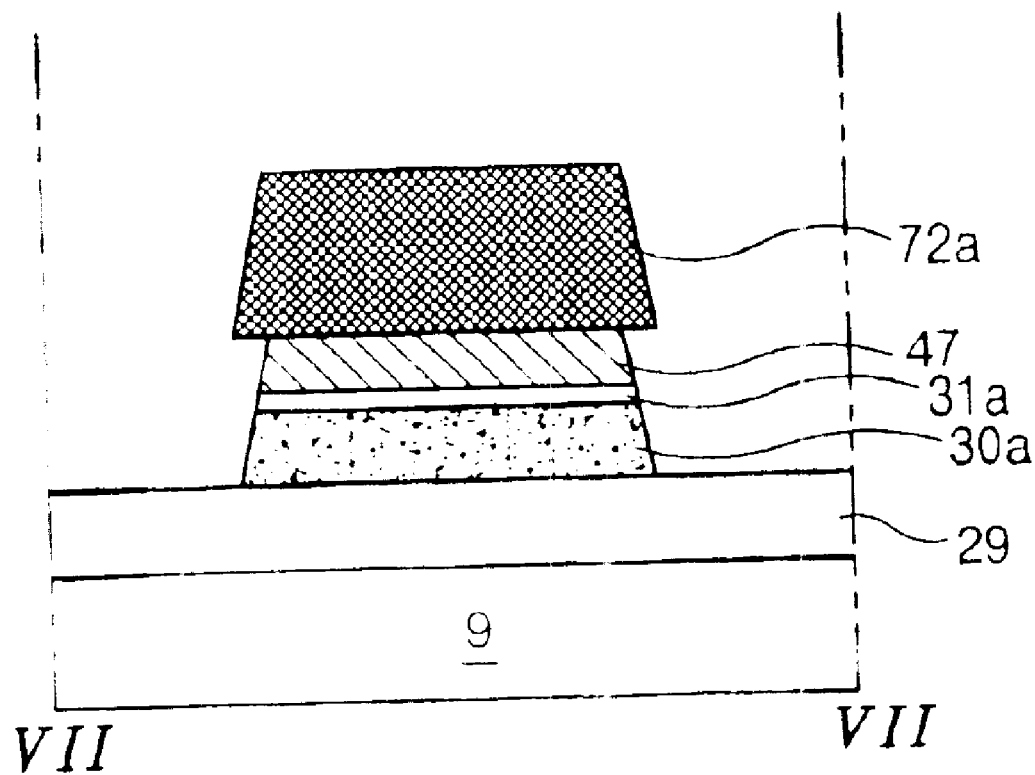
Figure 10A:
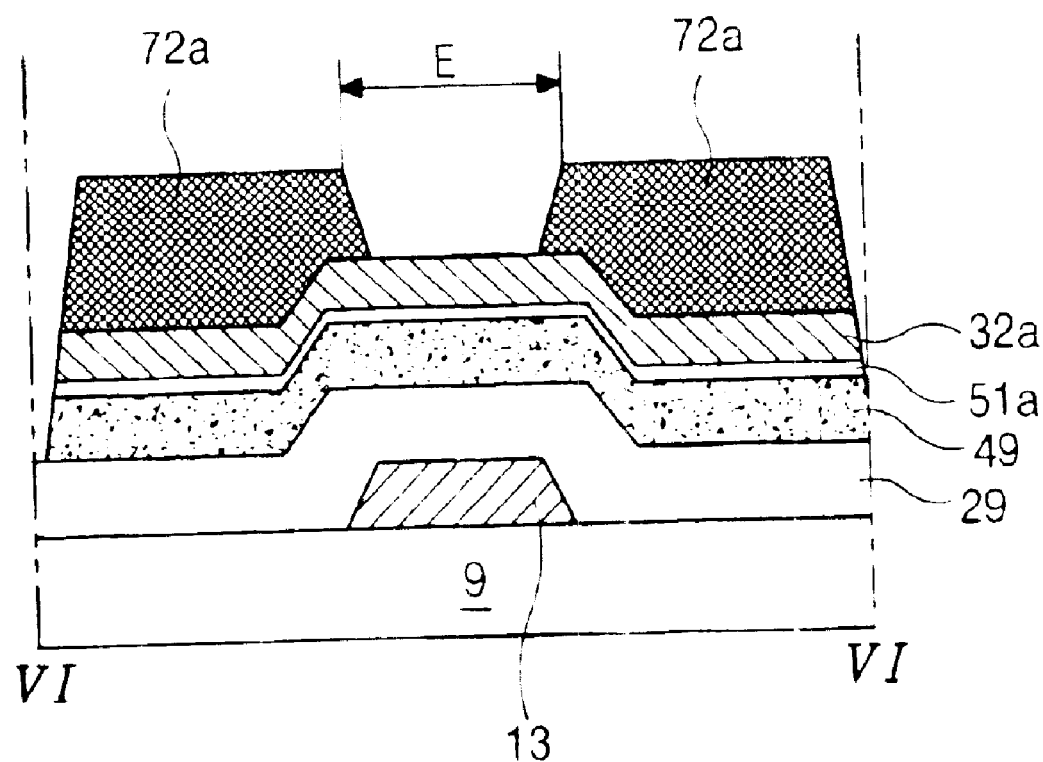
FIGS. 10A and 10B are cross sectional views of another second mask process of the array substrate along VI—VI of FIG. 5 according to the related art.
Figure 10B:
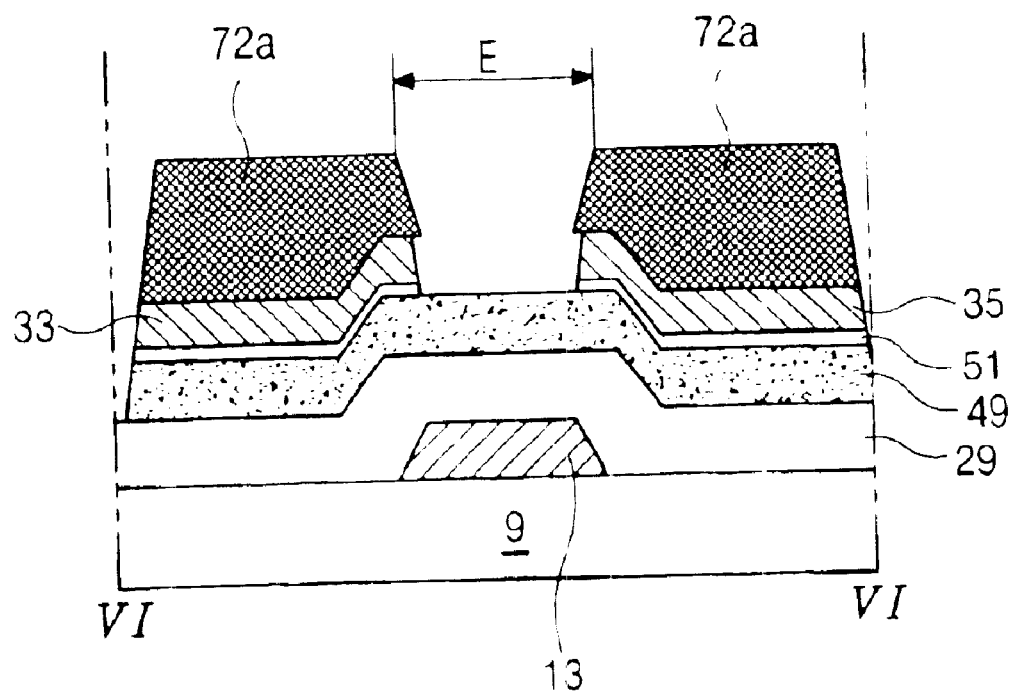
Figure 11A:
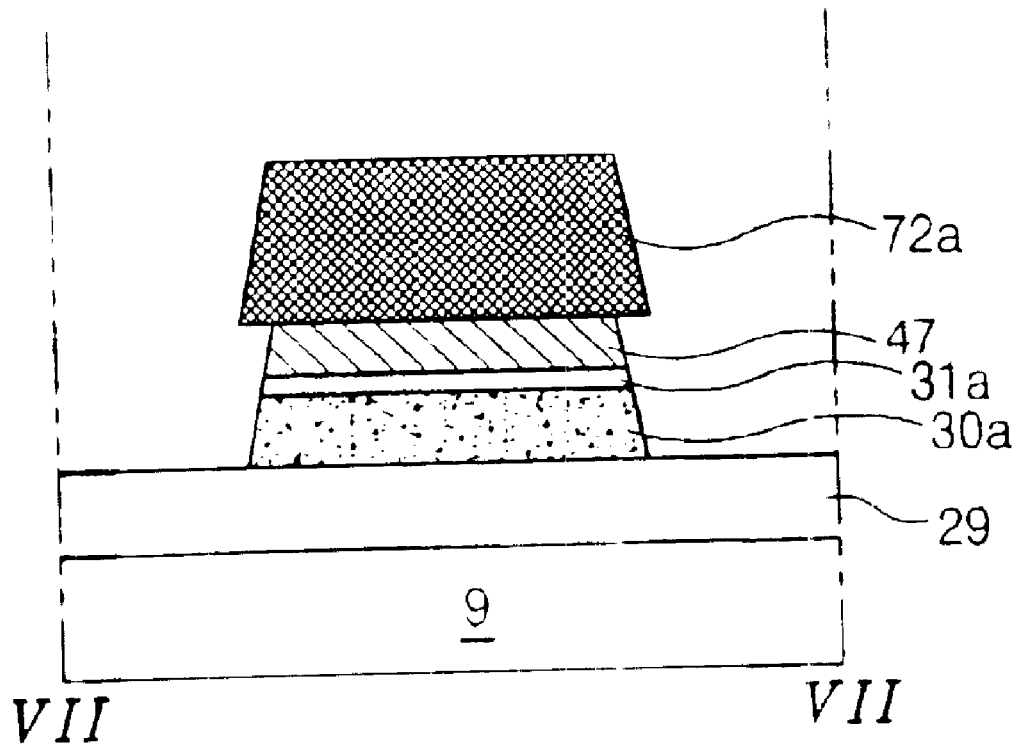
FIGS. 11A and 11B are cross sectional views of another second mask process of the array substrate along VII—VII of FIG. 2 according to the related art.
Figure 11B:
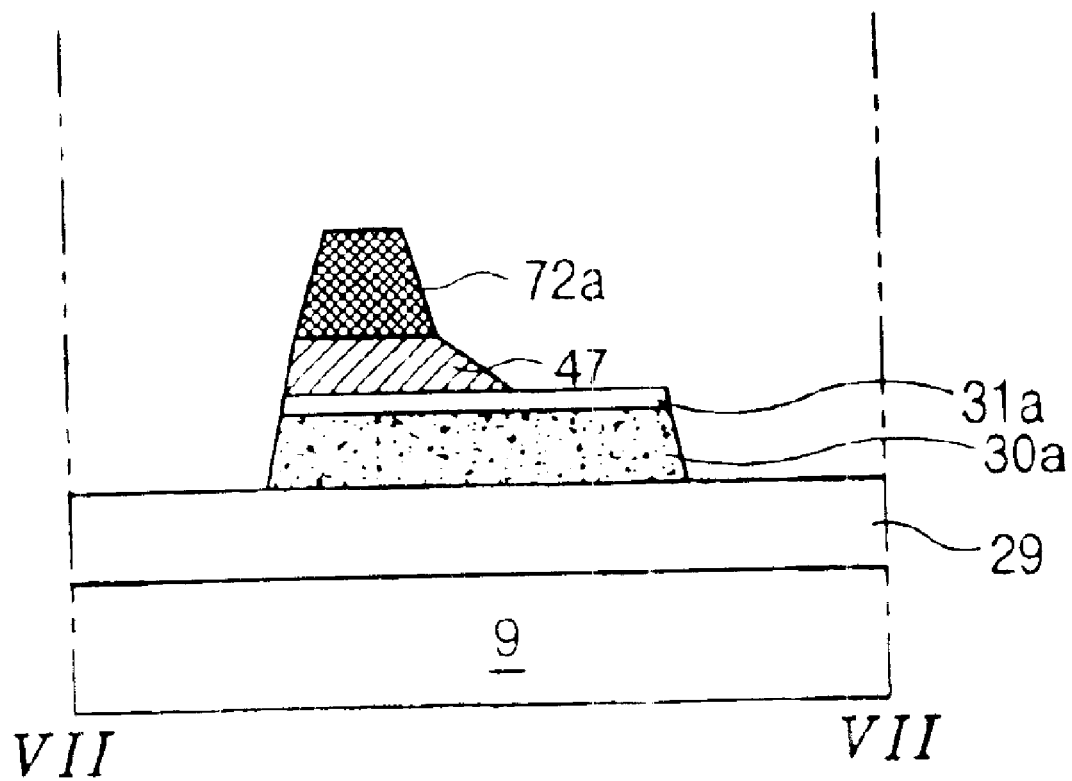
Figure 12:
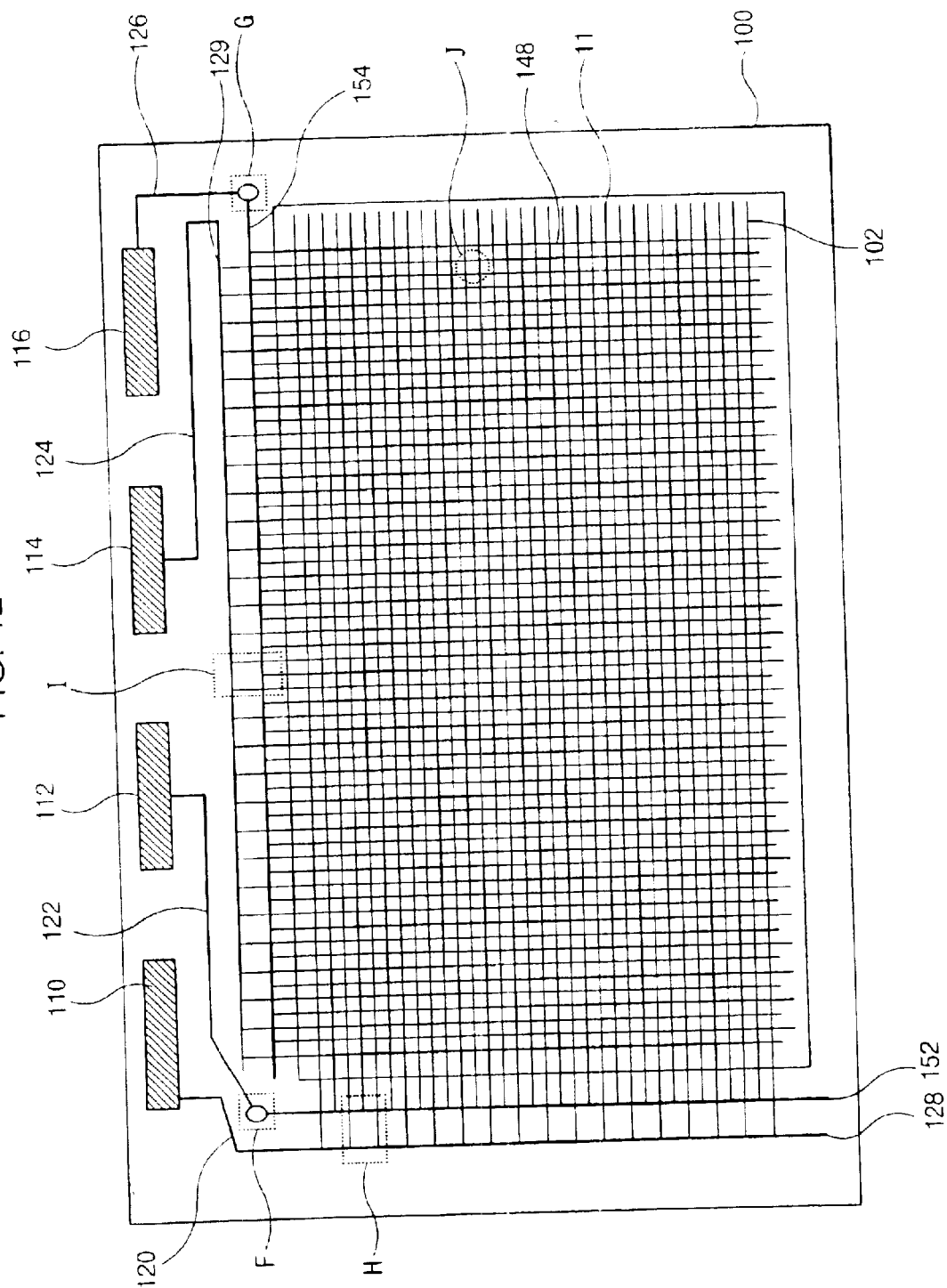
FIG. 12 is a plan view of an exemplary array substrate for a liquid crystal display (LCD) device according to the present invention.
Figure 13A:
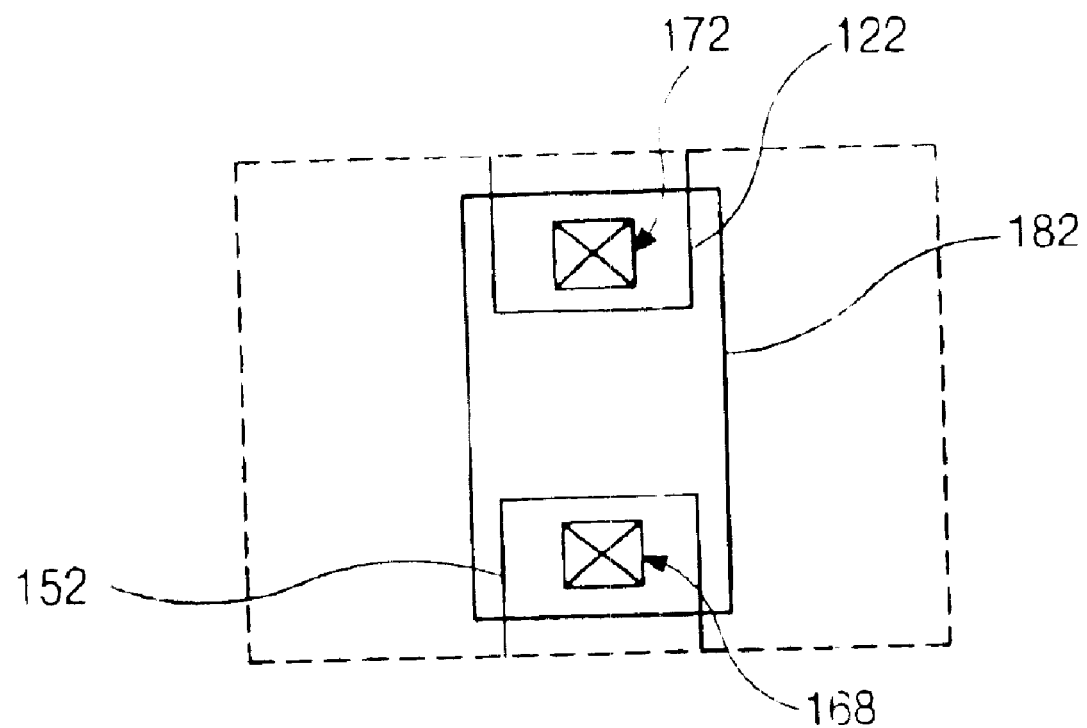
FIG. 13A is an enlarged plan view of region "F" of FIG. 12 according to the present invention.
Figure 13B:
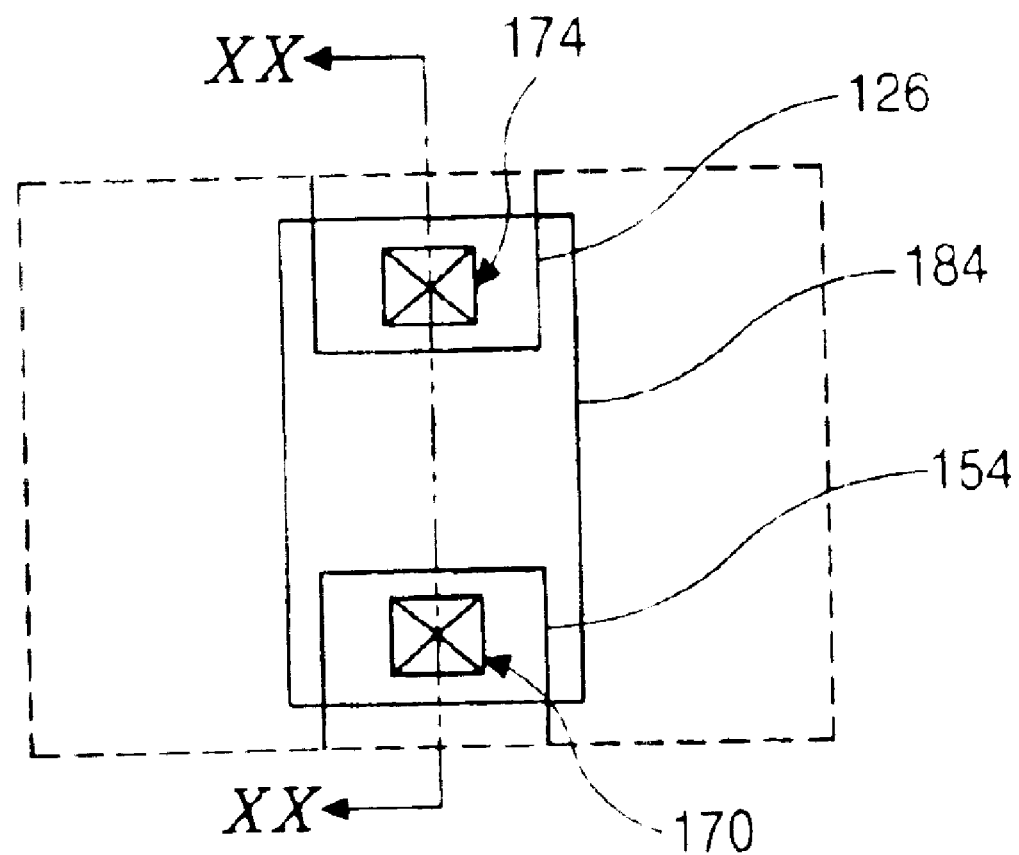
FIG. 13B is an enlarged plan view of region "G" of FIG. 12 according to the present invention.
Figure 14:
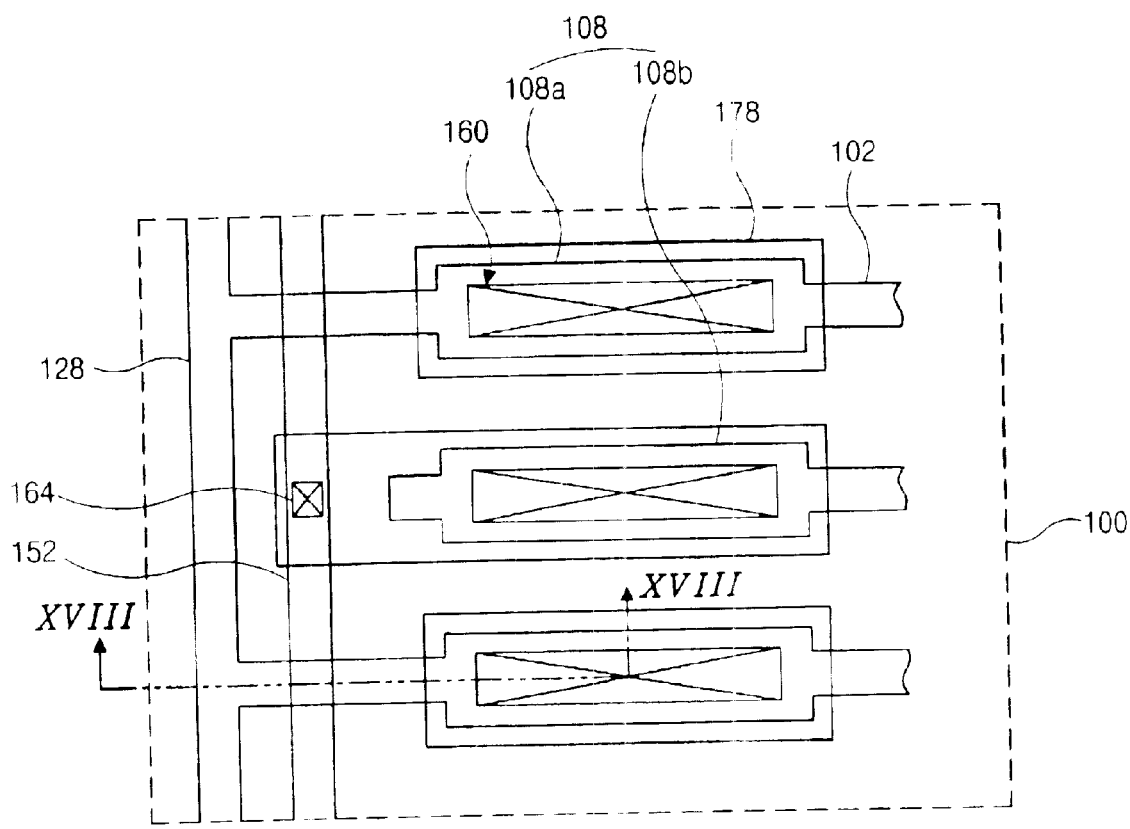
FIG. 14 is an enlarged plan view of region "H" of FIG. 12 according to the present invention.
Figure 15:
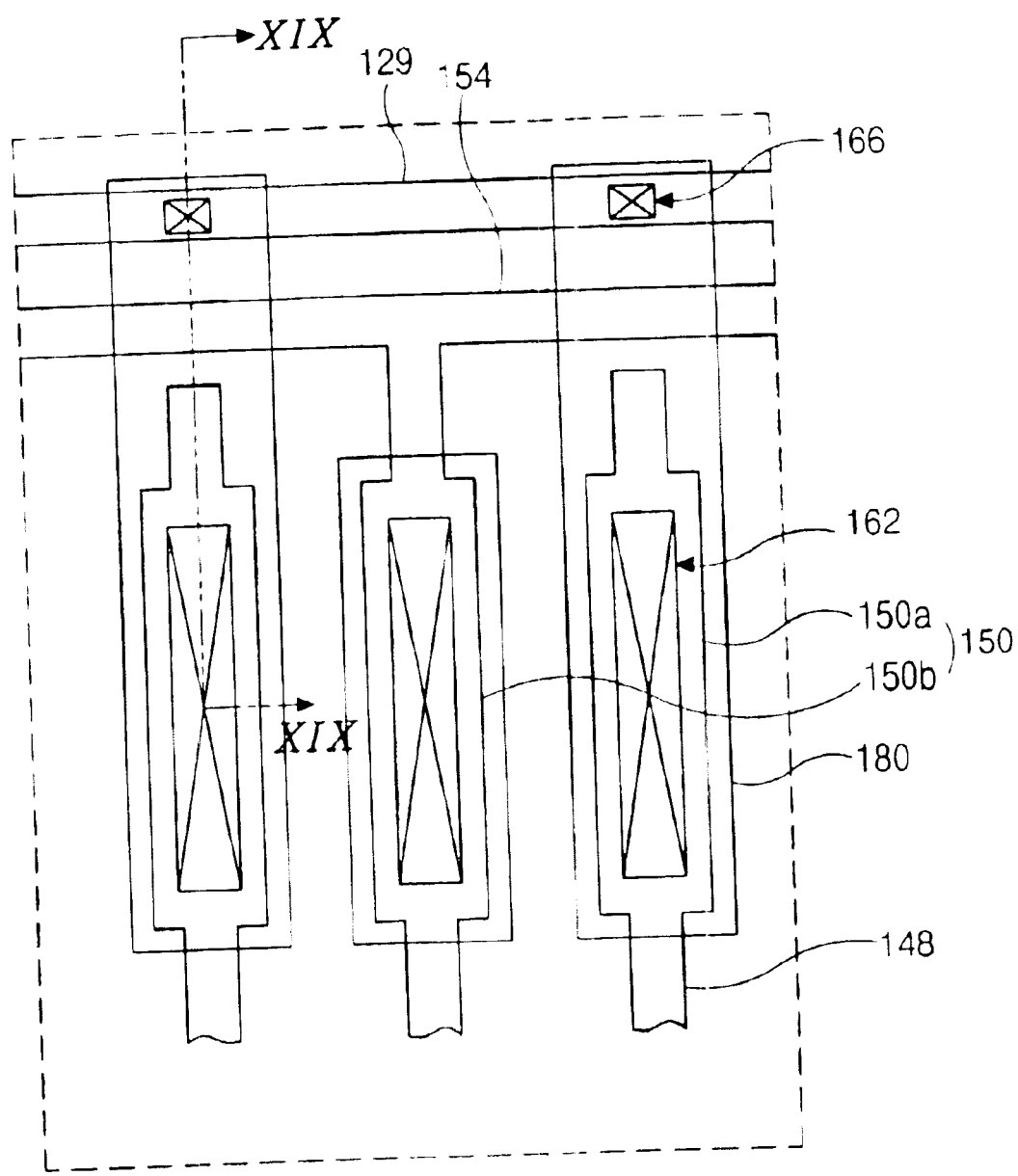
FIG. 15 is an enlarged plan view of region "I" of FIG. 12 according to the present invention.
Figure 16:
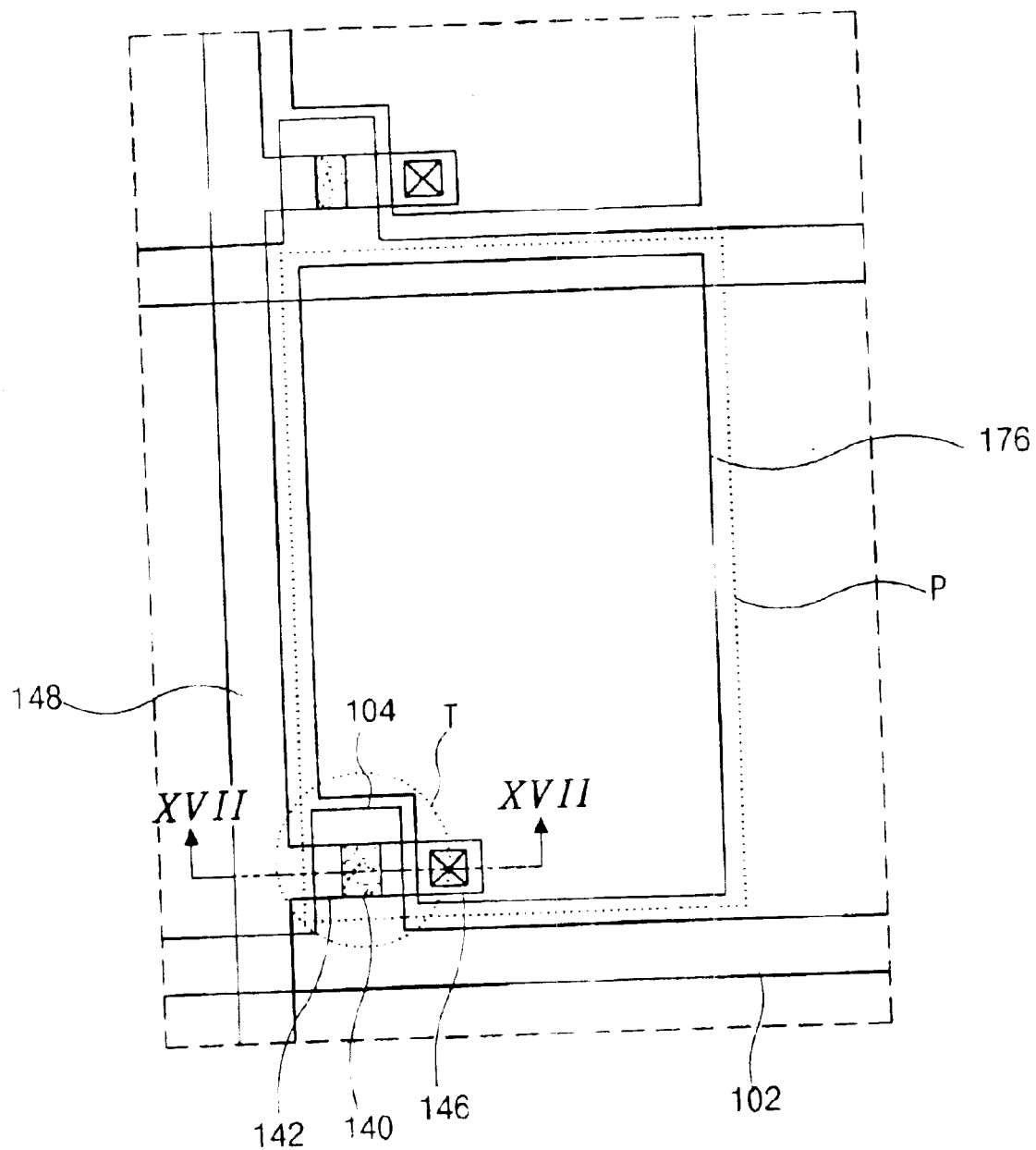
FIG. 16 is enlarged plan view of region "J" of FIG. 12 according to the present invention.
Figure 17A:
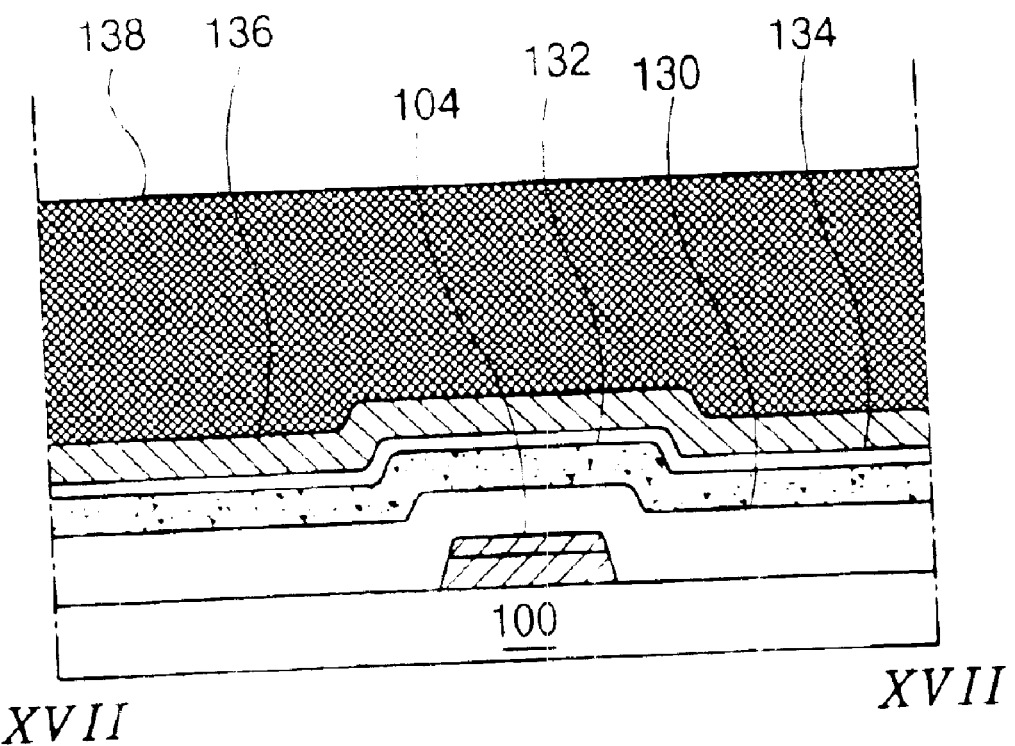
FIGS. 17A to 17G are cross sectional views of an exemplary manufacturing method along XVII—XVII of FIG. 16 according to the present invention.
Figure 17B:
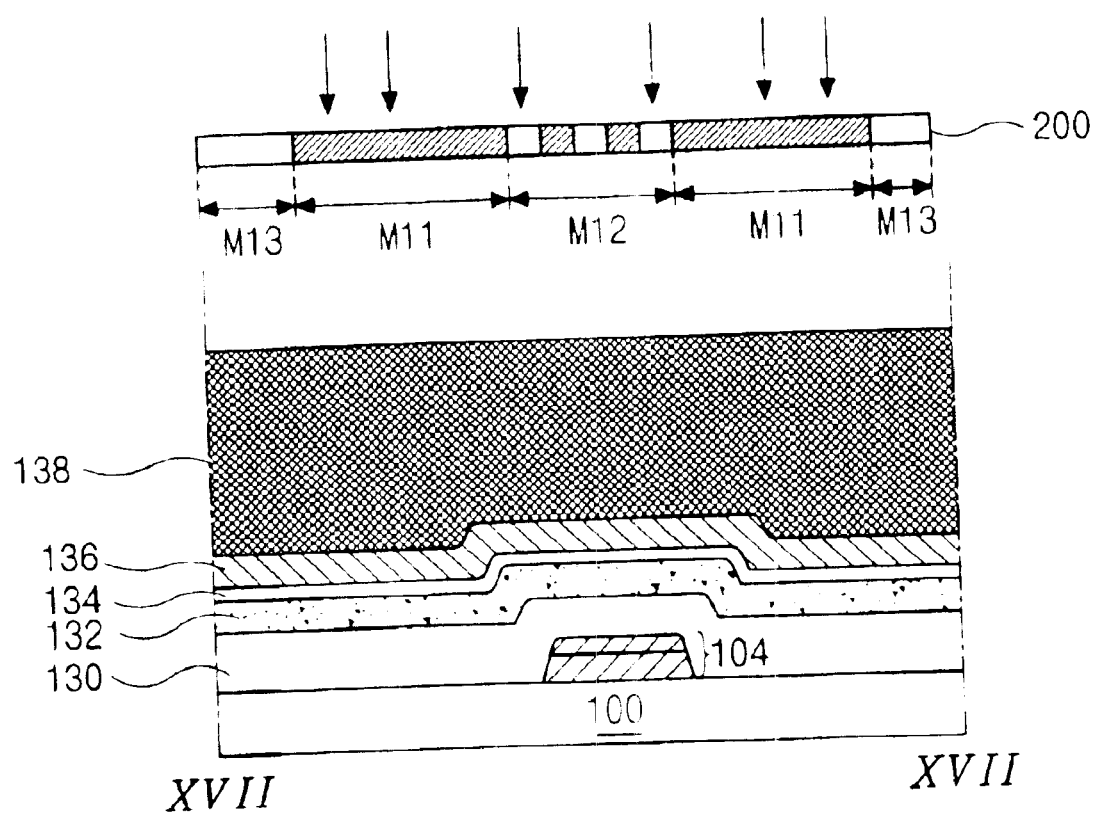
Figure 17C:
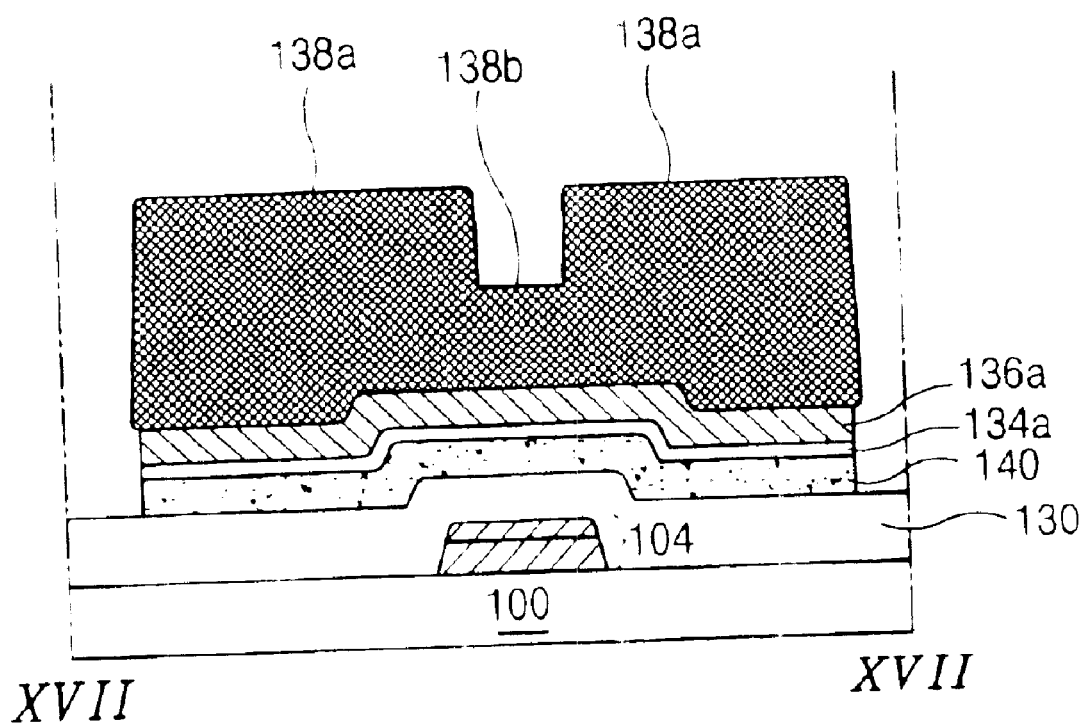
Figure 17D:
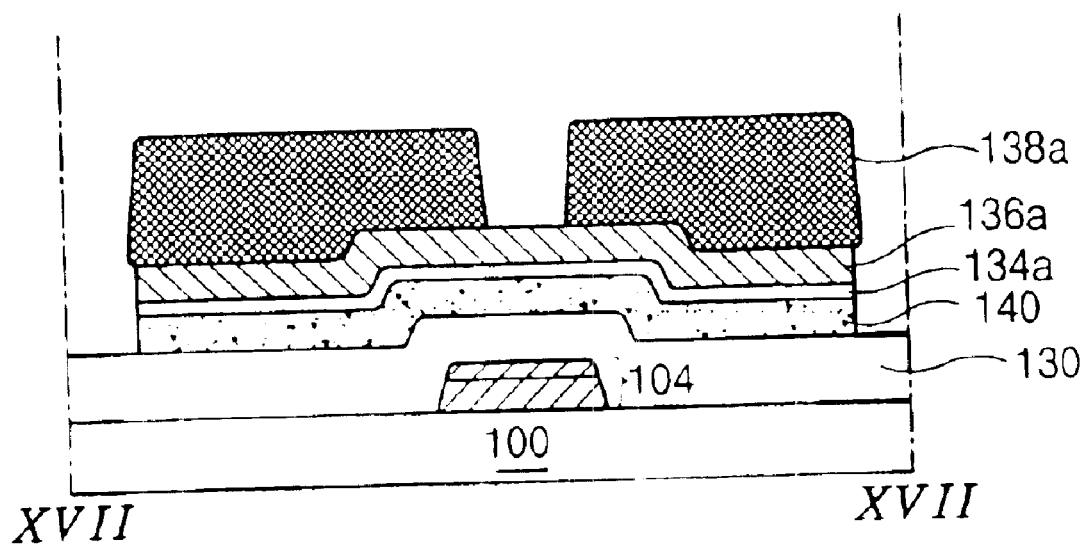
Figure 17E:
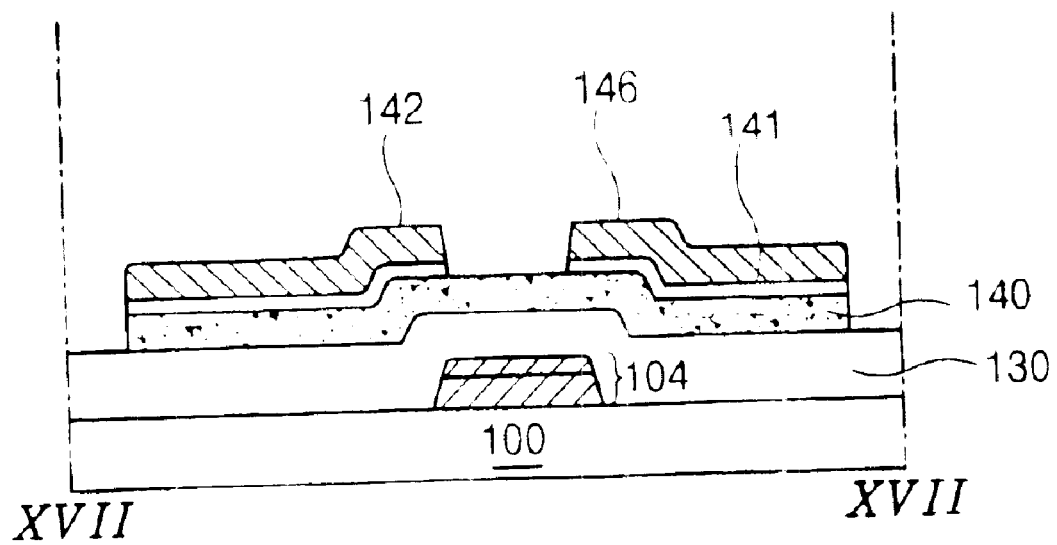
Figure 17F:
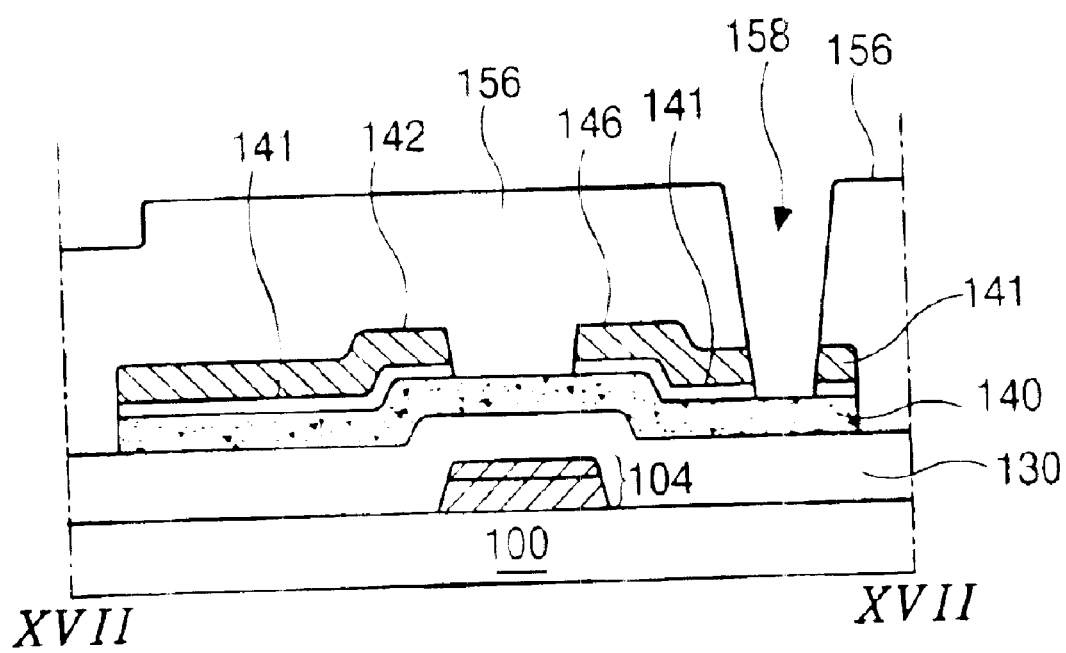
Figure 17G:
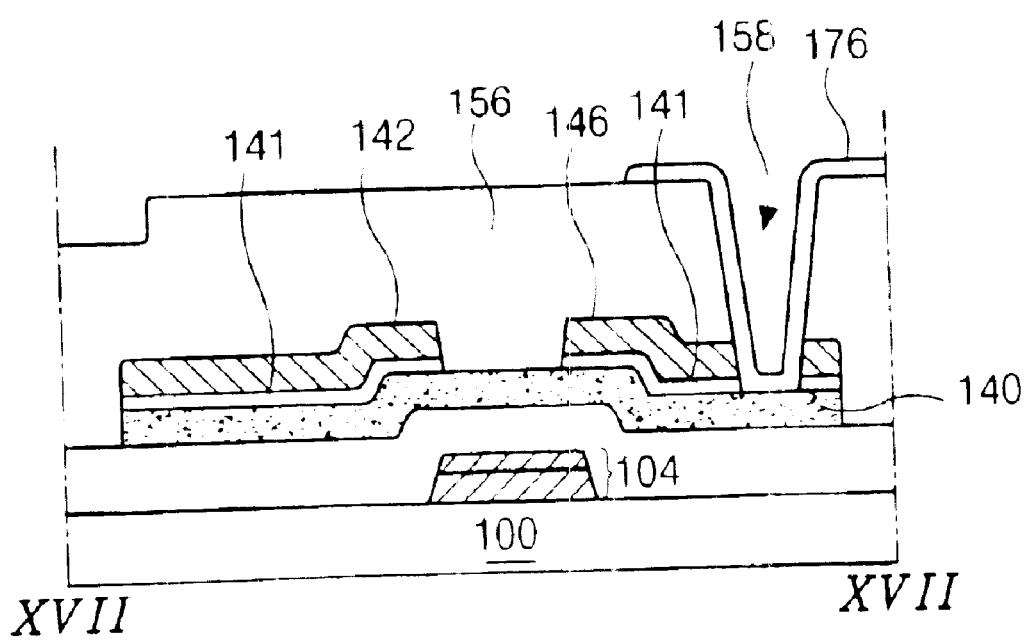
Figure 18A:
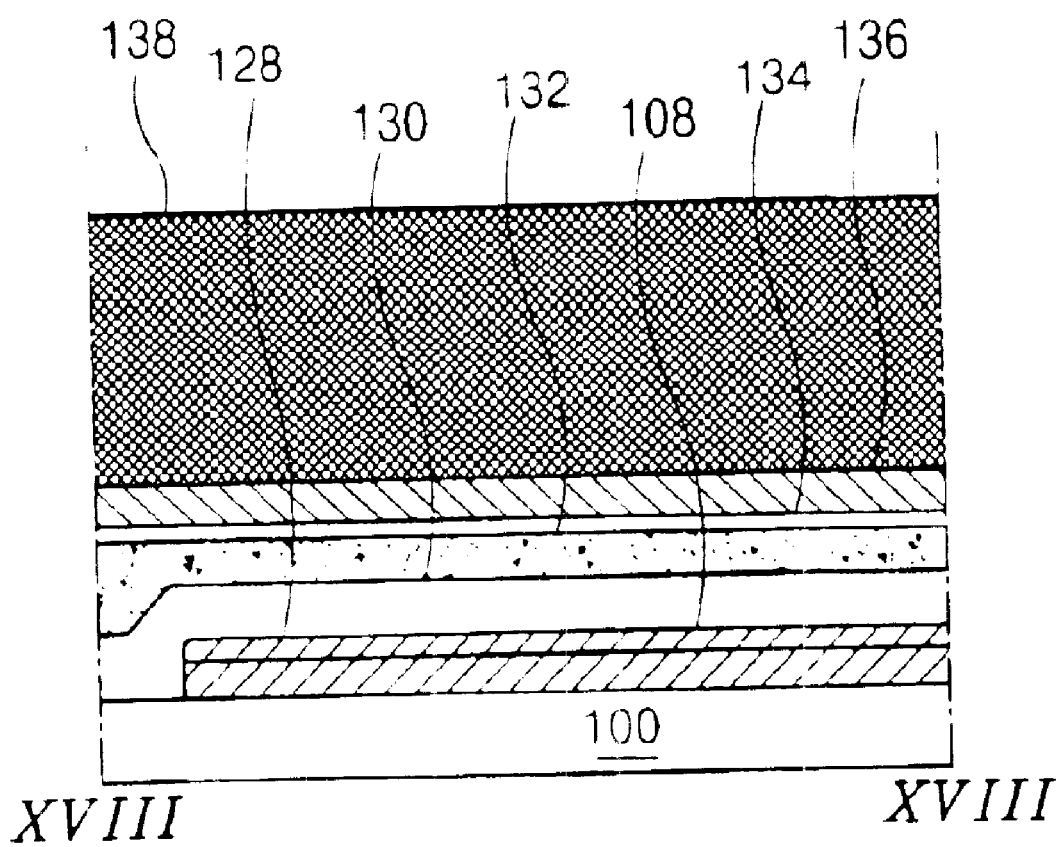
FIGS. 18A to 18G are cross sectional views of the exemplary manufacturing method along XVIII—XVIII of FIG. 14 according to the present invention.
Figure 18B:
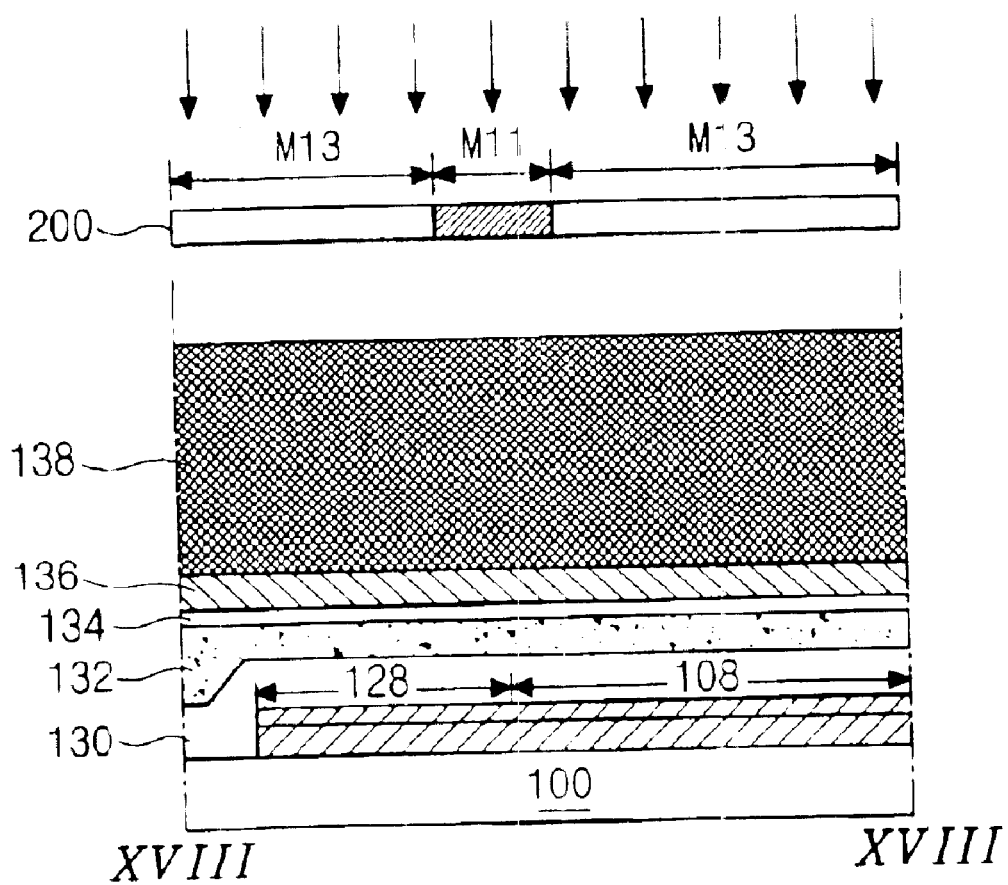
Figure 18C:
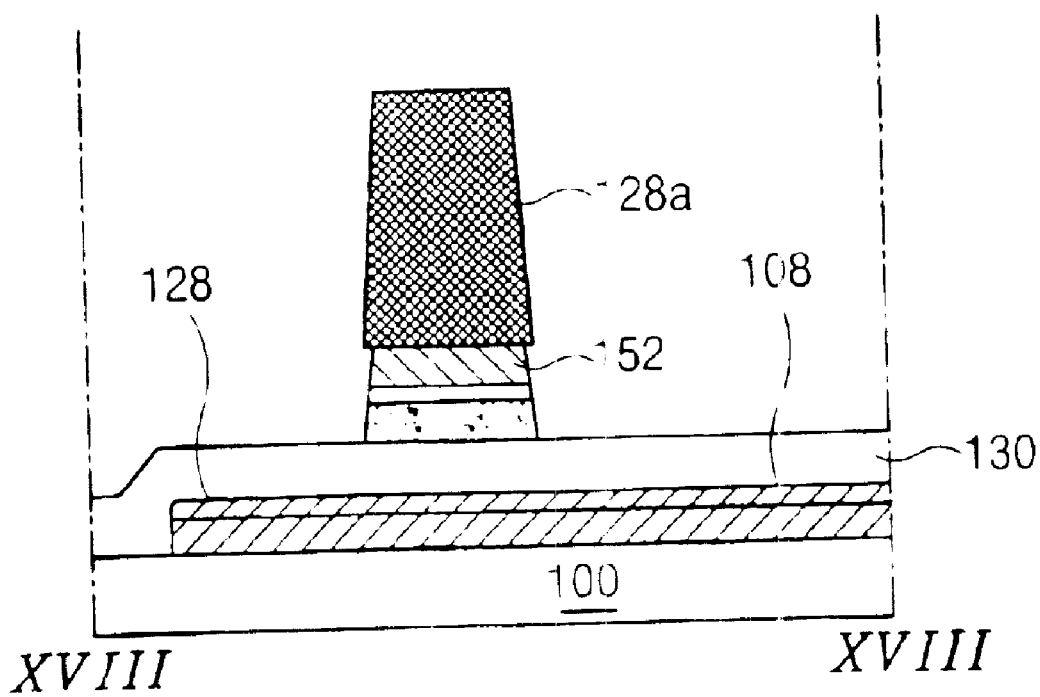
Figure 18D:
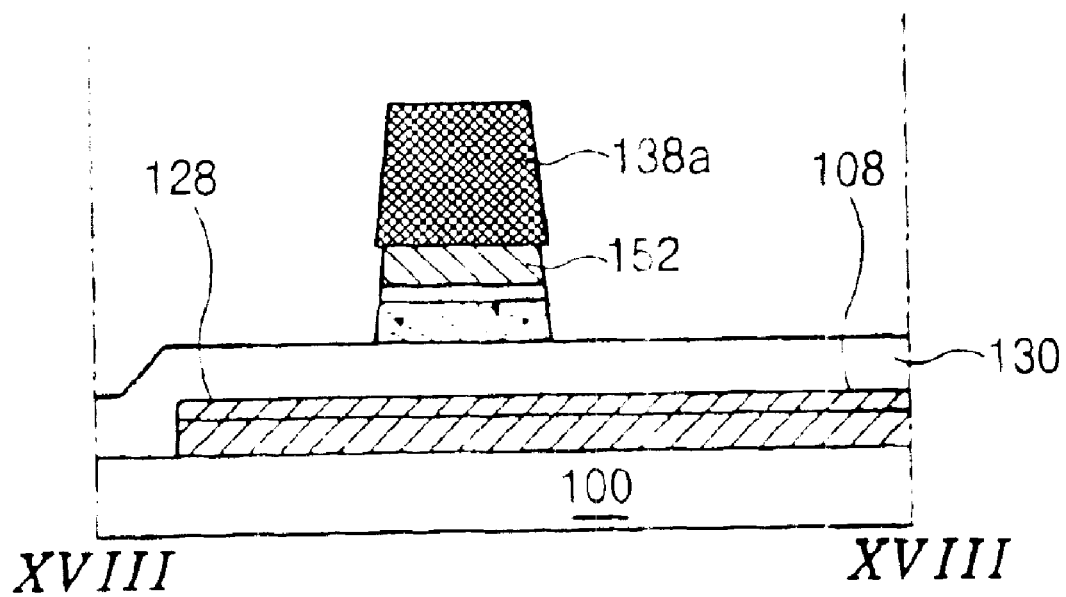
Figure 18E:
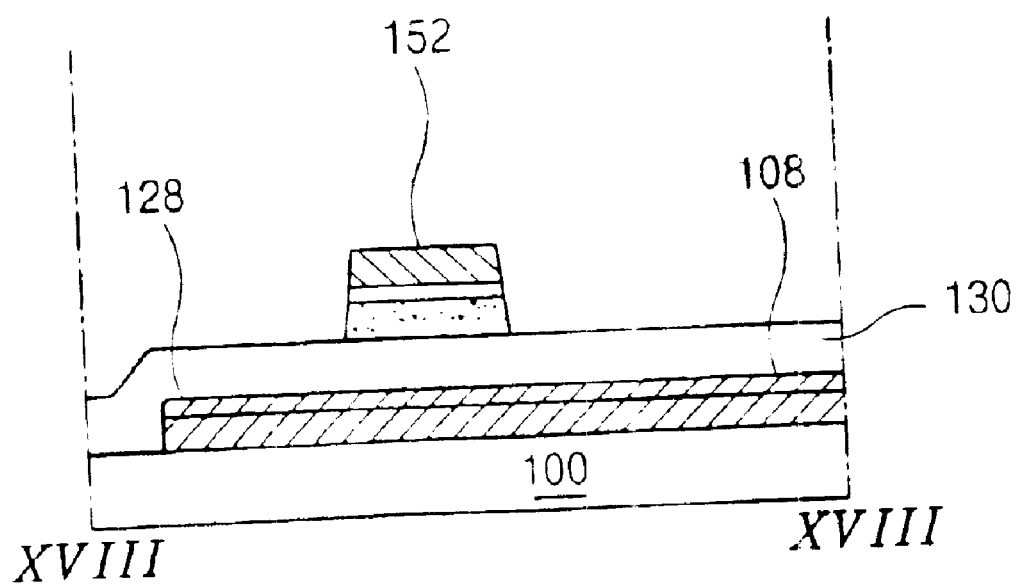
Figure 18F:
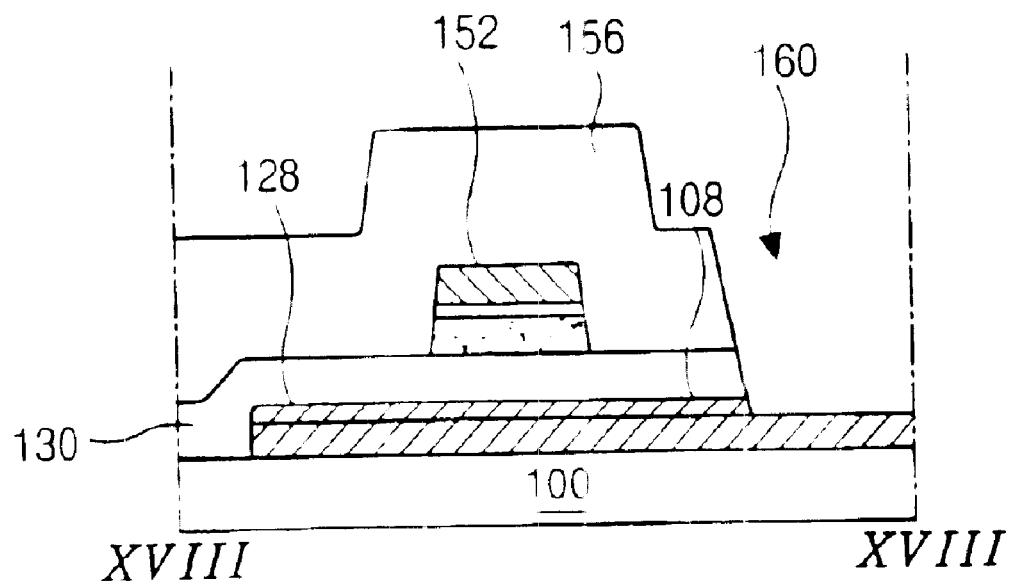
Figure 18G:
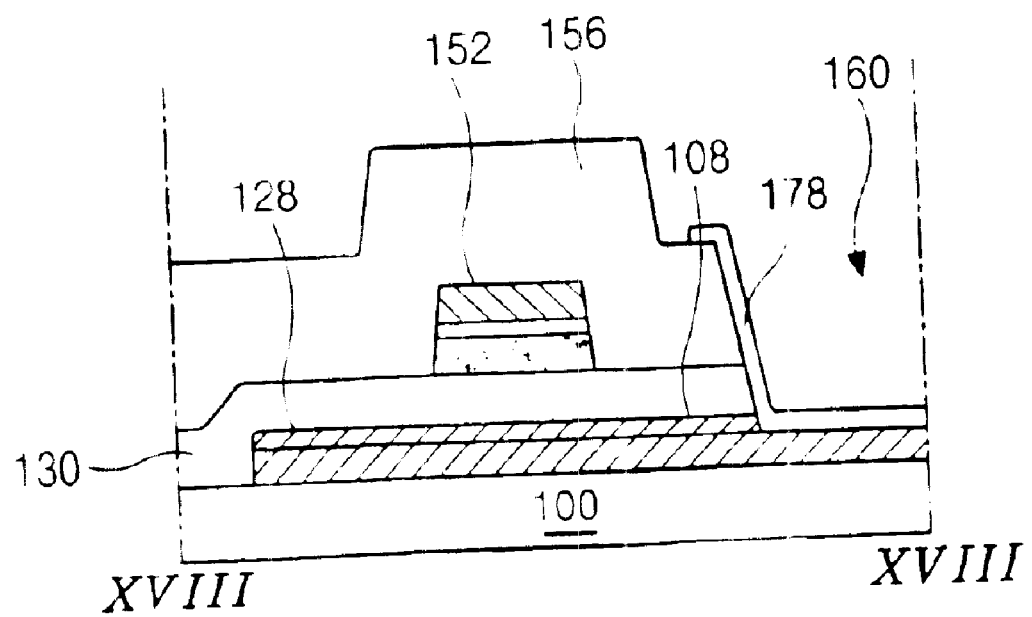
Figure 19A:
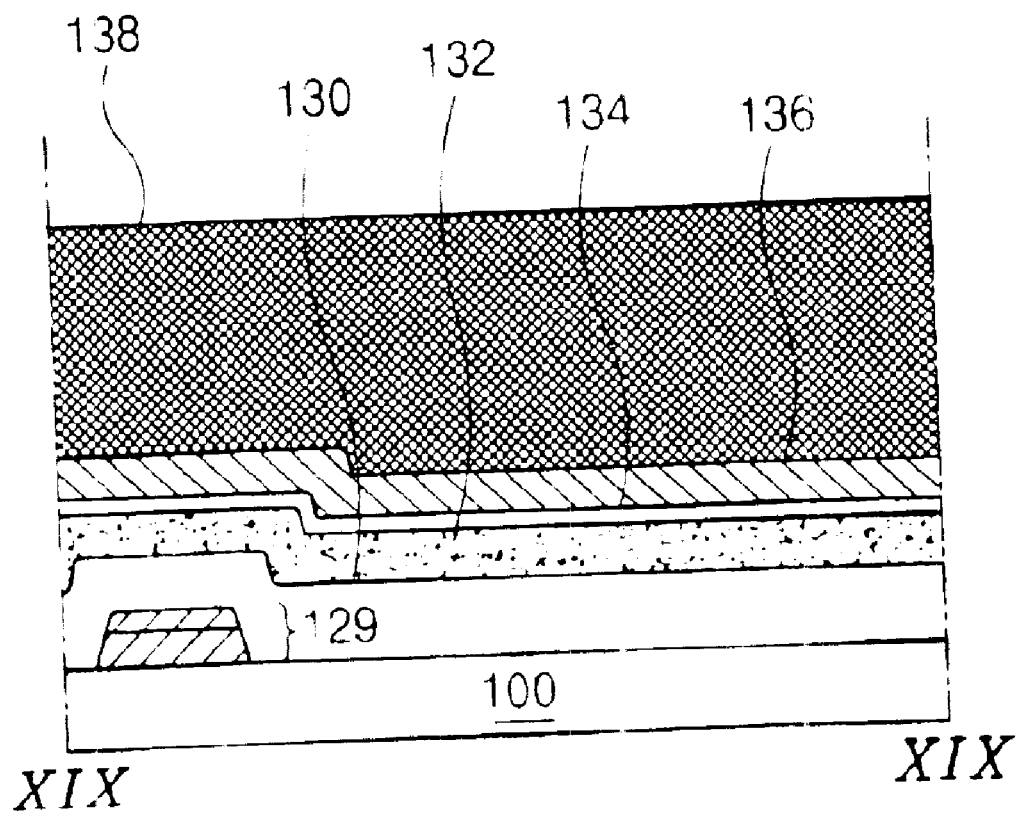
FIGS. 19A to 19G are cross sectional views of the exemplary manufacturing method along XIX—XIX of FIG. 15 according to the present invention.
Figure 19B:
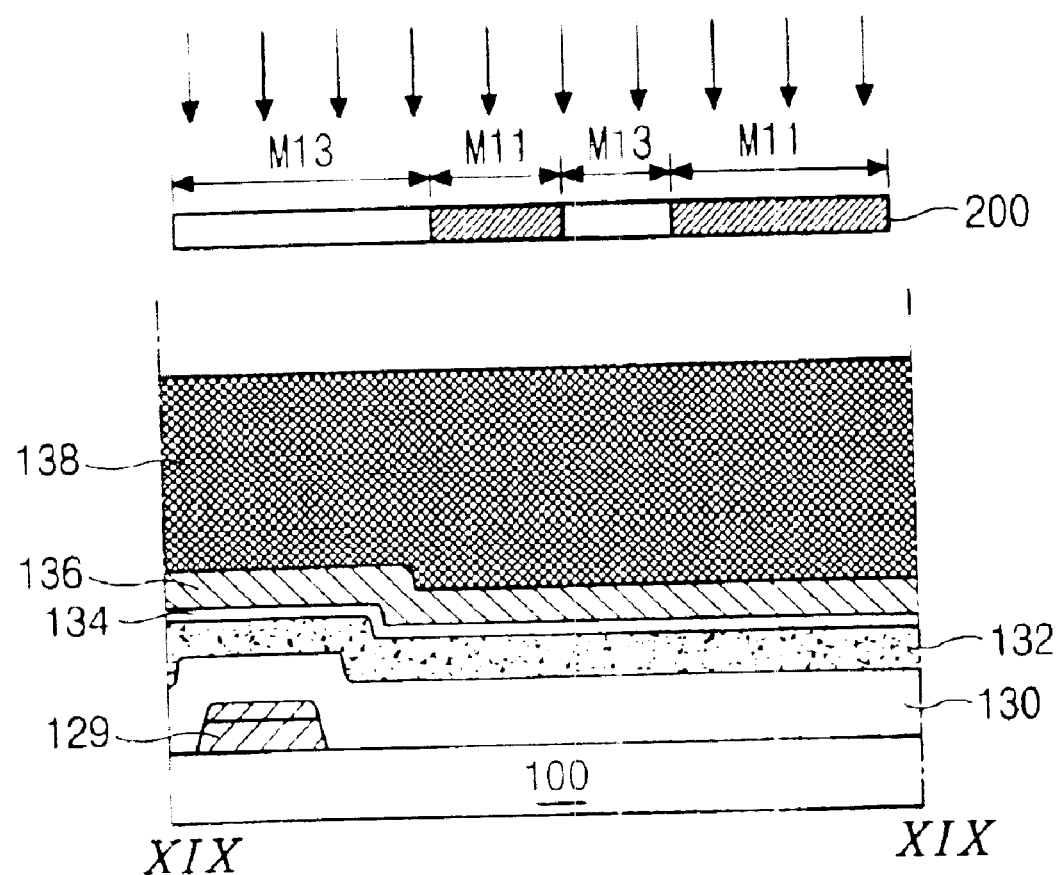
Figure 19C:
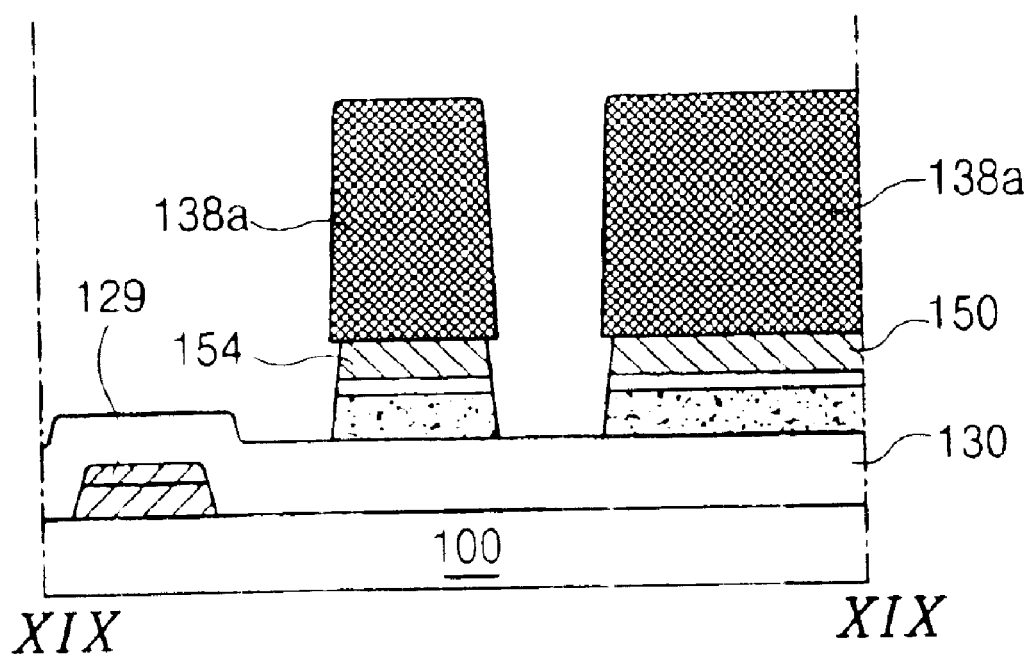
Figure 19D:
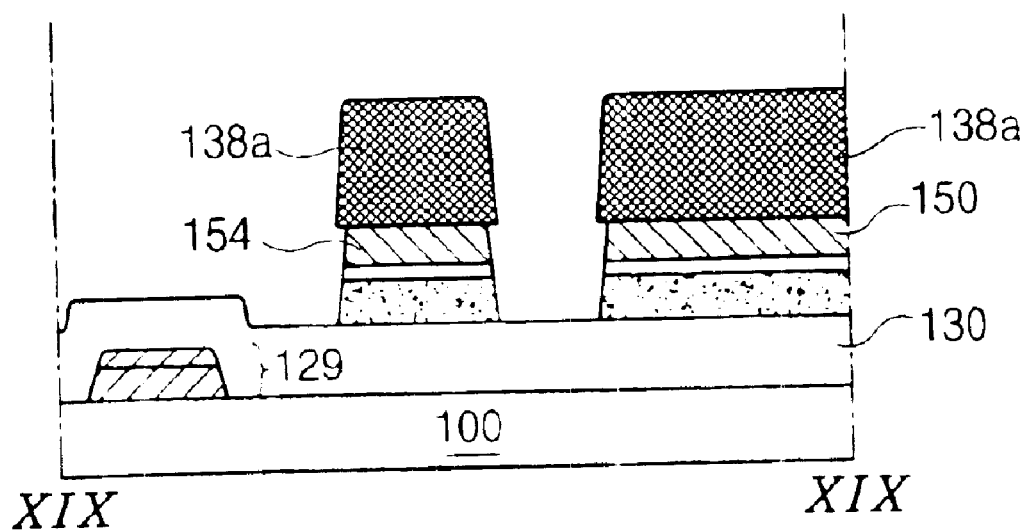
Figure 19E:
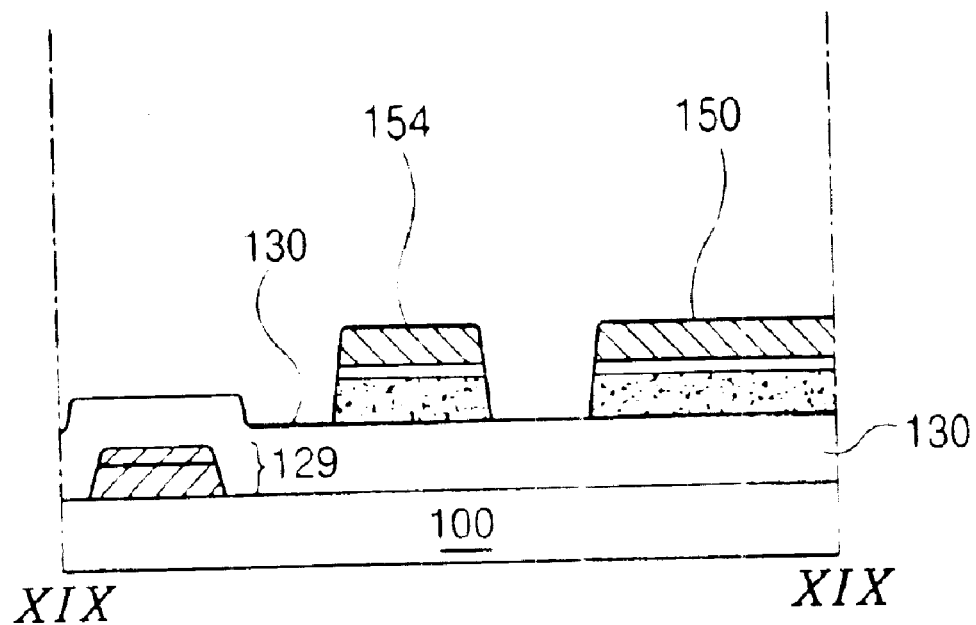
Figure 19F:
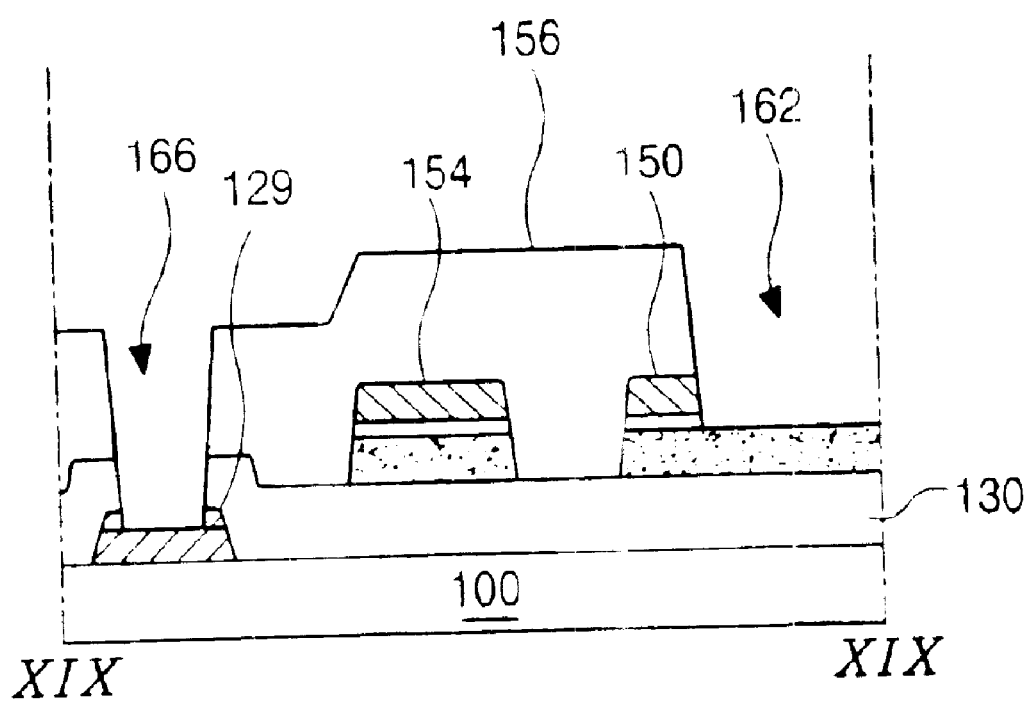
Figure 19G:
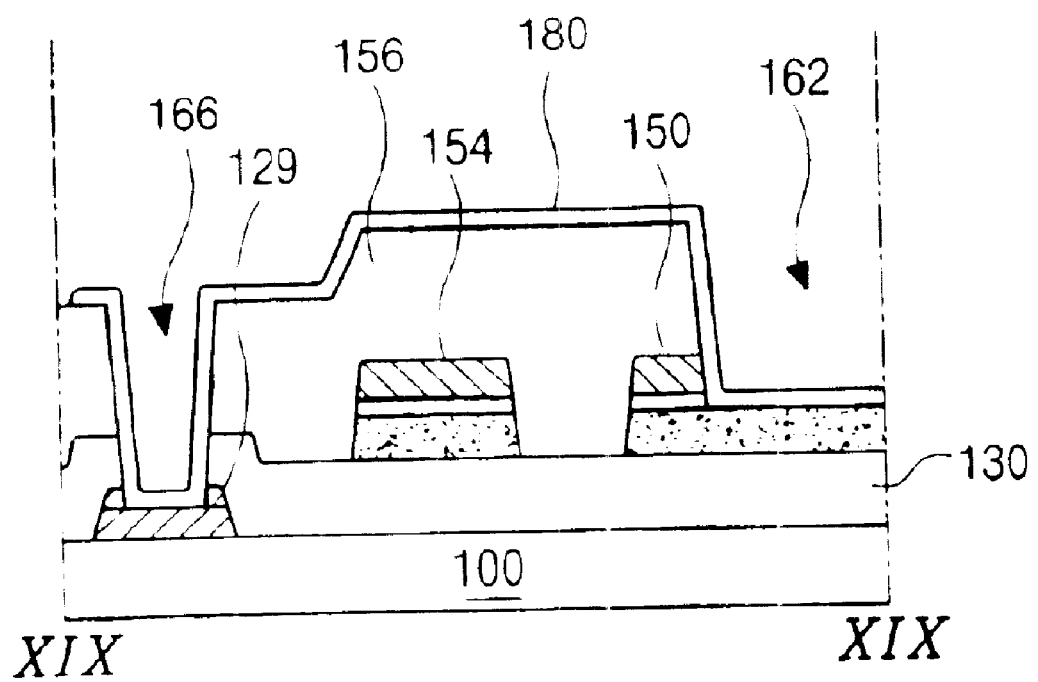
Figure 20A:
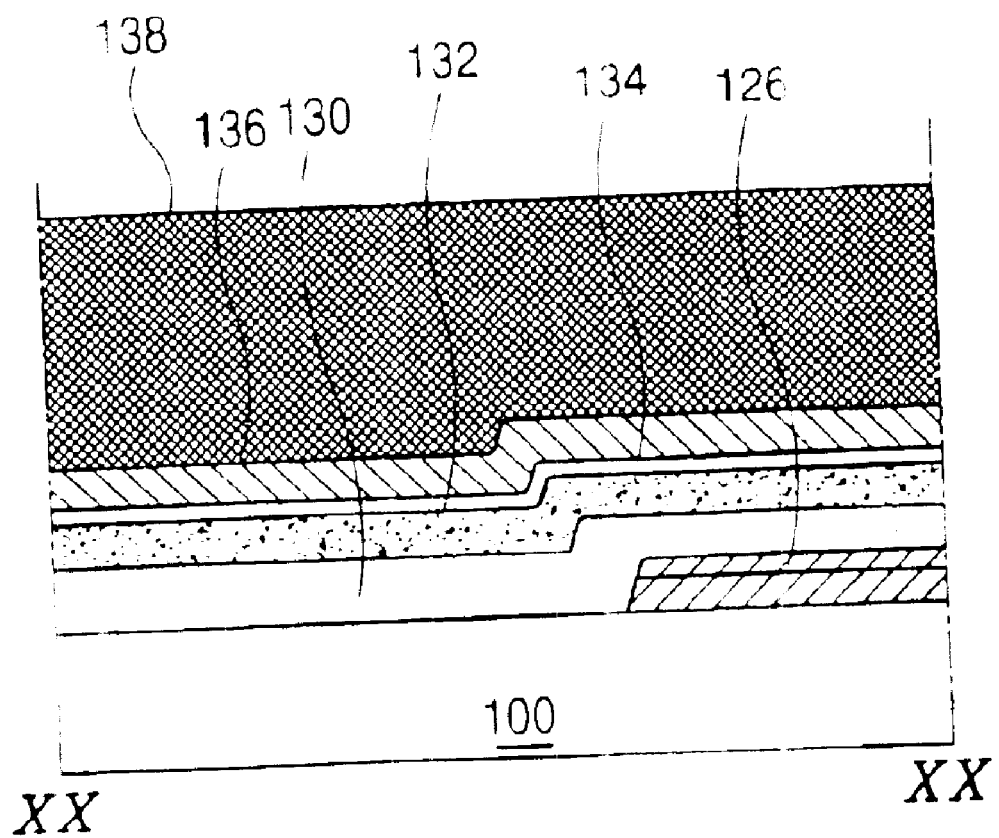
FIGS. 20A to 20G are cross sectional views of the exemplary manufacturing method along XX—XX of FIG. 13B according to the present invention.
Figure 20B:
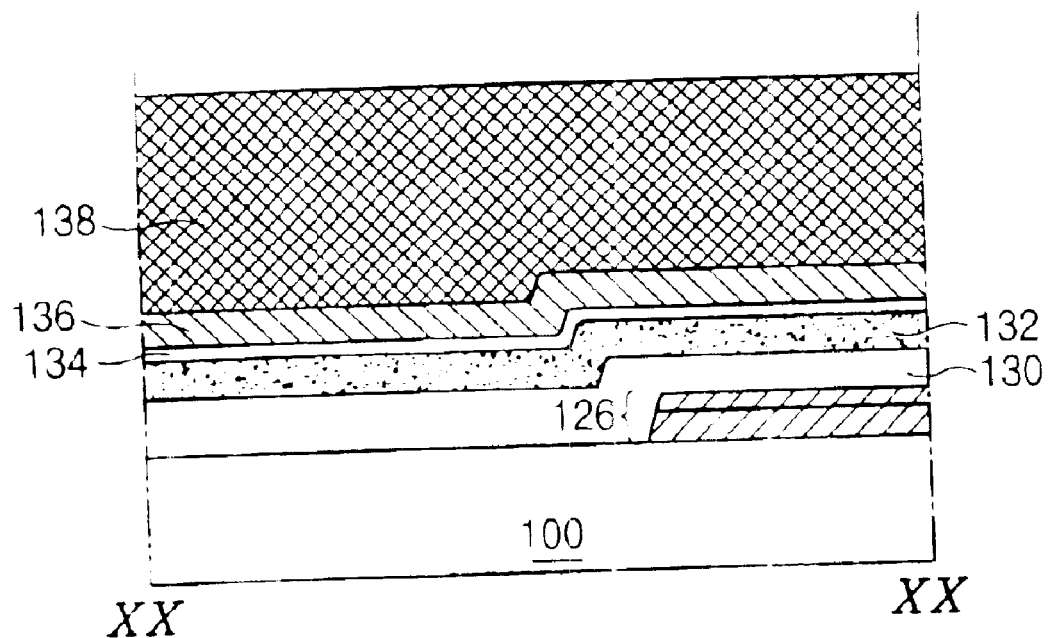
Figure 20C:
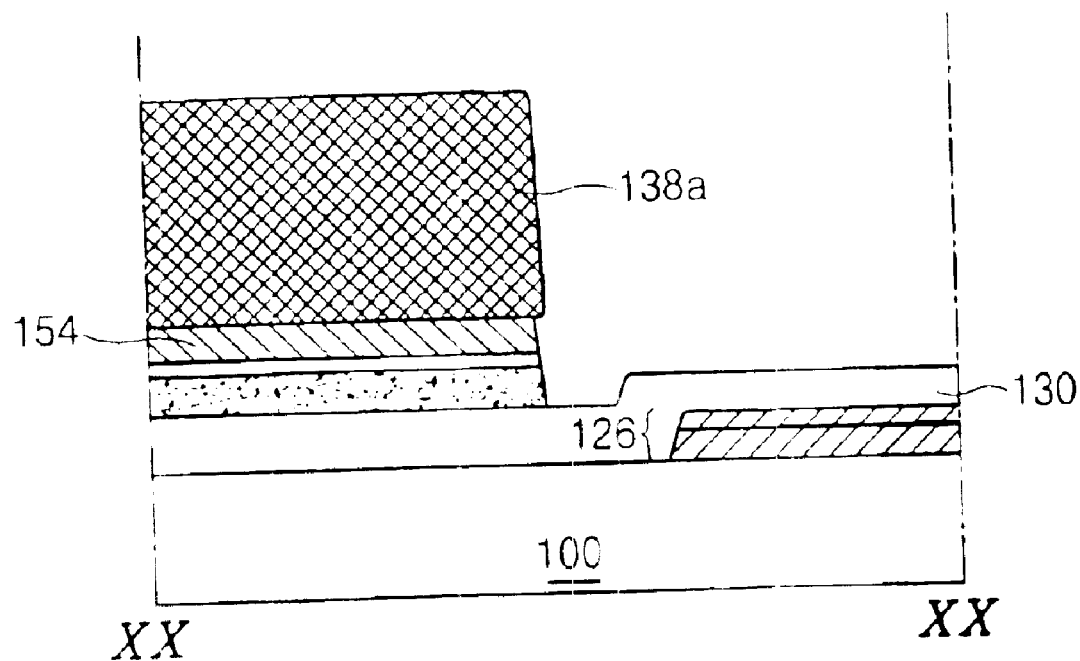
Figure 20D:
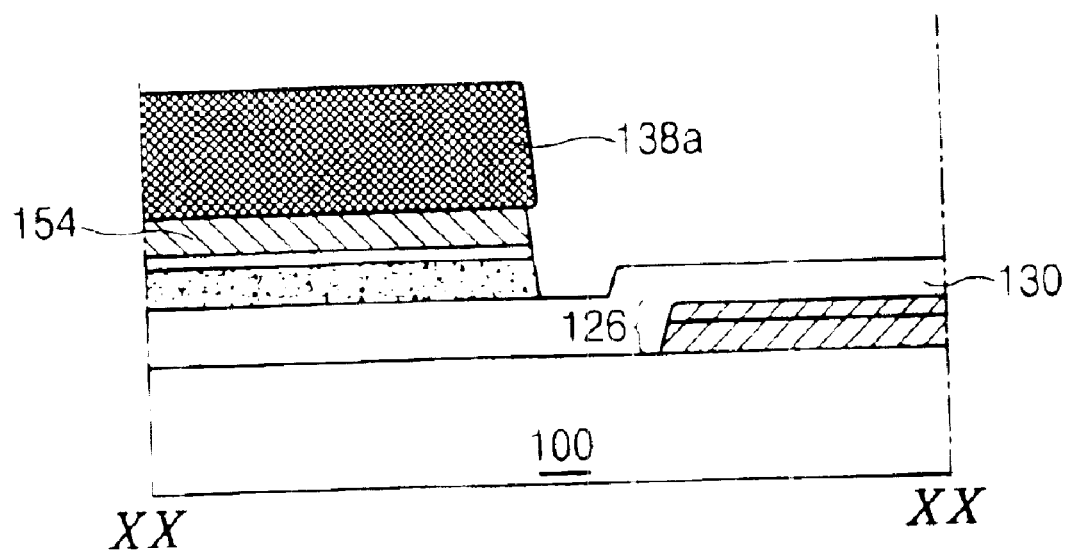
Figure 20E:
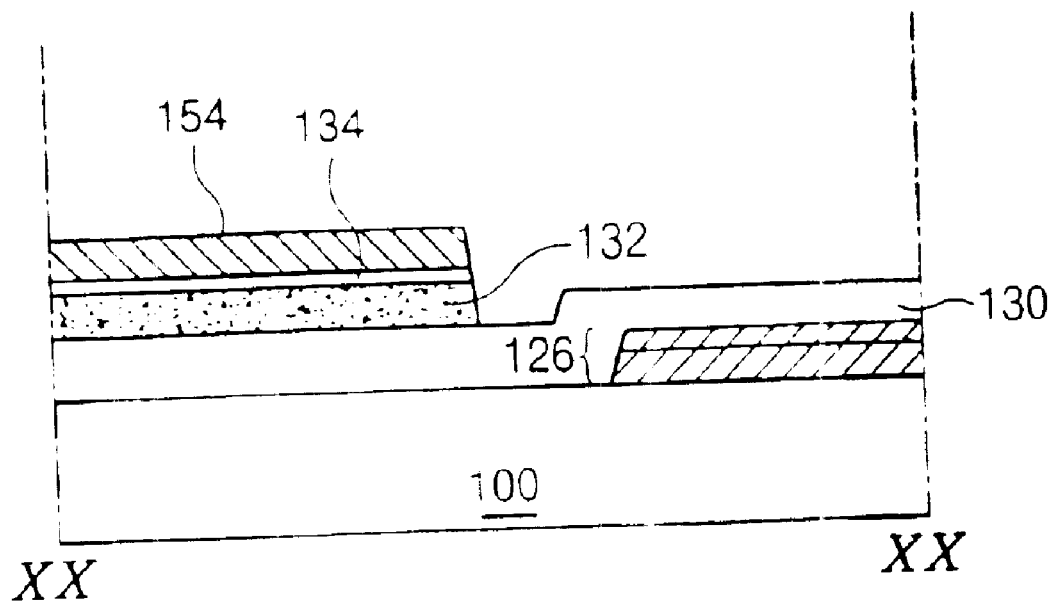
Figure 20F:
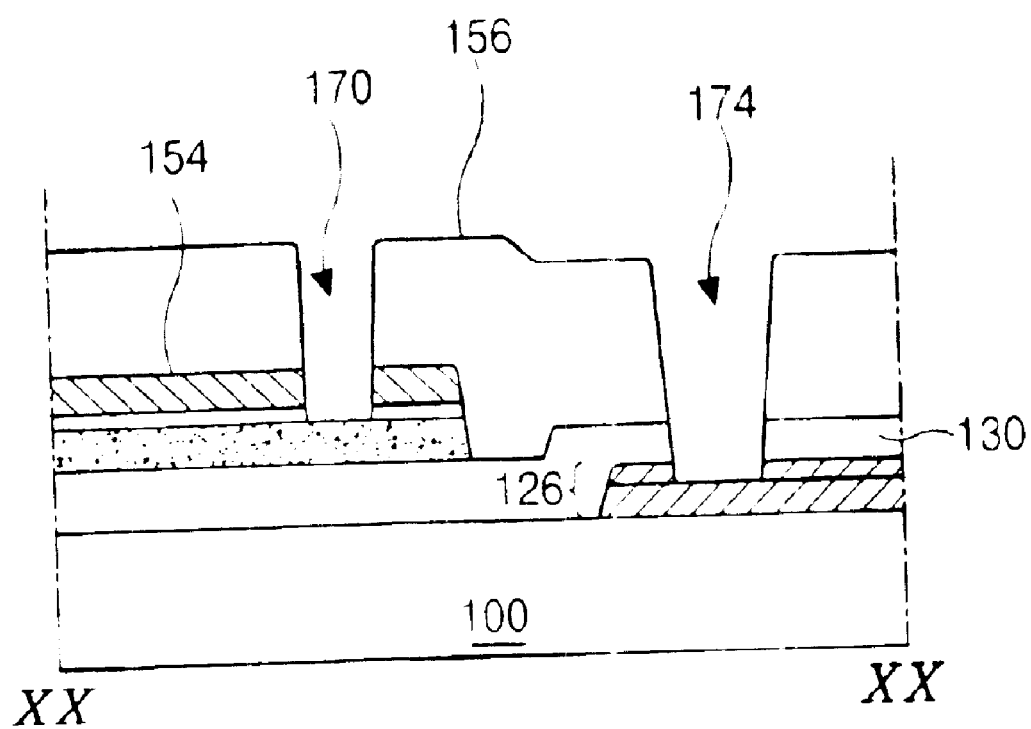
Figure 20G:
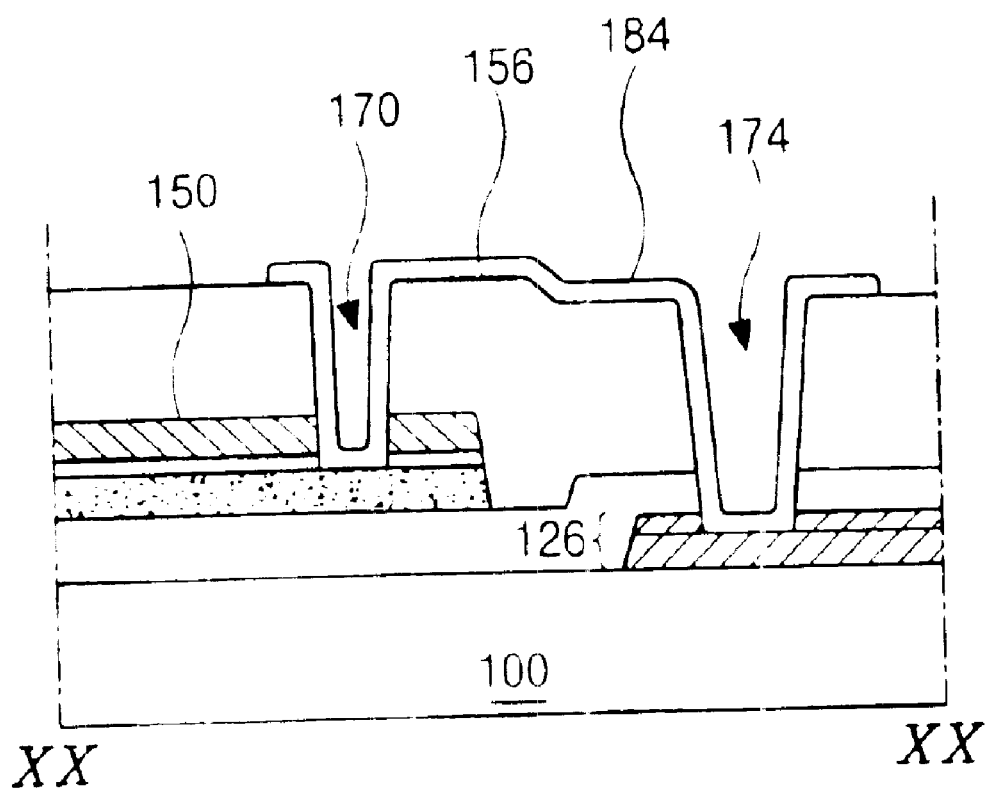

FIG. 12 is a plan view of an exemplary array substrate for a liquid crystal display (LCD) device according to the present invention, FIG. 13A is an enlarged plan view of region "F" of FIG. 12 according to the present invention, FIG. 13B is an enlarged plan view of region "G" of FIG. 12 according to the present invention, FIG. 14 is an enlarged plan view of region "H" of FIG. 12 according to the present invention, FIG. 15 is an enlarged plan view of region "I" of FIG. 12 according to the present invention, and FIG. 16 is enlarged plan view of region "J" of FIG. 12 according to the present invention.

As shown in FIGS. 12–16, a plurality of gate lines 102 and a plurality of data lines 148 may be formed on a substrate 100 to cross each other, thereby defining pixel areas P. In addition, a thin film transistor T may be formed at the crossing of the gate and data lines 102 and 148 to function as a switching element, and may include a gate electrode 104 connected to the gate line 102 for receiving scanning signals, a source electrode 142 connected to the data line 148 for receiving data signals, a drain electrode 146 spaced apart from the source electrode 142, and an active layer 140 disposed between the gate electrode 104 and the source and drain electrodes 142 and 146. In addition, a pixel electrode 176 may be formed in the pixel area P, and may be connected to the drain electrode 146.

In FIG. 14, a gate pad 108 maybe formed at one end of the gate line 102, and may include odd and even gate pads 108a and 108b. In addition, a gate pad terminal 178 may contact and overlap the gate pad 108, and may be formed of the same material as the pixel electrode 176. The odd gate pad 108a may be connected to a first shorting bar 128, and the even gate pad 108b may be connected to a second shorting bar 152 through the gate pad terminal 178.

In FIG. 15, a data pad 150 may be formed at one end of the date line 148, and may include odd and even data pads 150a and 150b. In addition, a data pad terminal 180 may contact and overlap the data pad 150, and may be formed of the same material as the pixel electrode 176. The odd data pad 150a may be connected to a third shorting bar 129 through the data pad terminal 180, and the even data pad 150b may be connected to a fourth shorting bar 154.

In FIGS. 12, 14 and 15, first to fourth test pads 110, 112, 114, and 116 may be formed along a line parallel with the third shorting bar 129 on the substrate 100, and may be spaced apart from each other. The first to fourth test pads 110, 112, 114, and 116 may be electrically connected to first, second, third, and fourth shorting bars 128, 152, 129, and 154 via first, second, third, and fourth connecting lines 120, 122, 124, and 126, respectively.

In addition, the first and third shorting bars 128 and 129, the first to fourth test pads 110, 112, 114, and 116, and the first to fourth connecting lines 120, 122, 124, and 126 may be formed of the same material as the gate electrode 104, and the second and fourth shorting bars 152 and 154 may be made of the same material as the source or drain electrodes 142 and 146, such as molybdenum (Mo). Thus, the second and fourth shorting bars 152 and 154 and the second and fourth connecting lines 122 and 126 may be connected to each other through first and second connecting patterns 182 and 184, respectively (in FIGS. 13A and 13B). Accordingly, the fourth connecting line 126 may not be removed even if the source and drain electrodes 142 and 146 are formed of molybdenum, thereby reducing manufacturing processing time.

FIGS. 17A to 17G are cross sectional views of an exemplary manufacturing method along XVII—XVII of FIG. 16 according to the present invention, FIGS. 18A to 18G are cross sectional views of the exemplary manufacturing method along XVIII—XVIII of FIG. 14 according to the present invention, FIGS. 19A to 19G are cross sectional views of the exemplary manufacturing method along XIX—XIX of FIG. 15 according to the present invention, and FIGS. 20A to 20G are cross sectional views of the exemplary manufacturing method along XX—XX of FIG. 13B according to the present invention.

In FIGS. 17A, 18A, 19A, and 20A, a gate line 102 (in FIG. 16), a gate electrode 104 and a gate pad 108 may be formed on a substrate 100 by depositing a first metal layer, and patterning the first metal layer through a first mask process. The gate electrode 104 may extend from the gate line 102, and the gate pad 108 may be located at one end of the gate line 102.

First to fourth test pads 110, 112 114, and 116 (in FIG. 12), first to fourth connecting lines 120, 122, 124 (in FIG. 12), and 126, a first shorting bar 128, and a third shorting bar 129 may also be formed on the substrate 100. As detailed above, the first shorting bar 128 may be connected to the odd gate pad 108a (in FIG. 14) and the third shorting bar 129 may be connected to the odd data pad 150a (in FIG. 15) to be formed later. The first to fourth test pads 110, 112, 114, and 116 may be disposed along one side on the substrate 100, and may be parallel to the gate line 102 (in FIG. 12). The first to fourth connecting lines 120, 122, 124, and 126 may be connected to the first to fourth test pads 110, 112, 114, and 116, respectively. In addition, the first shorting bar 128 may be connected to the first connecting line 120, and the third shorting bar 129 may be connected to the third connecting line 124.

Alternatively, the first metal layer may include a double layer structure composed of a first layer including aluminum or an aluminum alloy that has relatively low resistance and a second layer including a metal material that can protect the first layer from chemical and thermal degradation, such as chromium (Cr) and molybdenum (Mo).

Next, a gate insulating layer 130, an amorphous silicon layer 132, a doped amorphous silicon layer 134, and a second metal layer 136 may be subsequently deposited on the substrate 100 including the gate electrode 104, the gate pad 108, the first shorting bar 128, the third shorting bar 129, and the fourth connecting line 126. A photoresist layer 138 is formed on the second metal layer 136 by coating photoresist material. The gate insulating layer 130 may include an inorganic insulating material, such as silicon nitride (SiNx) and silicon oxide (SiO$_2$), and the second metal layer 136 may include molybdenum.

In FIGS. 17B, 18B, 19B, and 20B, a mask 200 having a blocking portion M11, a half transmitting portion M12, and a transmitting portion M13 may be disposed over the photoresist layer 138. The half transmitting portion M12 may correspond to a channel of a thin film transistor, and the blocking portion M11 may correspond to a data line, source and drain electrodes, a second shorting bar, and a fourth shorting bar to be formed later. The photoresist layer 138 may be a positive type, wherein a portion exposed to light is developed and removed. Subsequently, the photoresist layer 138 may be exposed to light, and the photoresist layer 138 corresponding to the half transmitting portion M12 may be exposed to the light by an amount less than the photoresist layer 138 corresponding to the transmitting portion M13.

In FIGS. 17C, 18C, 19C, and 20C, the photoresist layer 138 (in FIGS. 17B, 18B, 19B, and 20B) may be developed, wherein a photoresist pattern having different thicknesses may be formed. A first thickness of the photoresist pattern 138a may correspond to the blocking portion M11 (in FIGS. 17B, 18B, 19B, and 20B), and a second thickness of the photoresist pattern 138b, which is thinner than the first thickness, may correspond to the half transmitting portion M12 (in FIG. 17B). The second metal layer 136, the doped amorphous silicon layer 134, and the amorphous silicon layer 132 (in FIGS. 17B, 18B, 19B, and 20B) that has been exposed by the photoresist pattern 138a and 138b may be removed. Thus, a source and drain pattern 136a, a data line 148 (of FIG. 16), a data pad 150, a second shorting bar 152, a fourth shorting bar 154, a doped amorphous silicon pattern 134a, and an active layer 140 may be formed. Then, the second metal layer 136, the doped amorphous silicon layer 134, and the amorphous silicon layer 118 (in FIGS. 17B, 18B, 19B, and 20B) may be patterned by a dry etching method since the second metal layer 136 may include molybdenum. Accordingly, fabricating time and costs may be reduced.

In addition, layers including amorphous silicon and doped amorphous silicon may also be formed under the second shorting bar 152 and the fourth shorting bar 154. The layers may have the same shape as the second and fourth shorting bars 152 and 154.

Next, in FIGS. 17D, 18D, 19D, and 20D, the first thickness photoresist pattern 138b (in FIG. 17C) may be removed through an ashing process, thereby exposing portions of the source and drain pattern 136a. At this time, the second thickness photoresist pattern 138a may also be partially removed and the thickness of the photoresist pattern 138a may be reduced.

In FIGS. 17E, 18E, 19E, and 20E, the source and drain pattern 136a (in FIG. 17D) and the doped amorphous silicon pattern 134a (in FIG. 17D) that have been exposed by the photoresist pattern 138a may be etched, thereby forming source and drain electrodes 142 and 146 and an ohmic contact layer 141. Next, the photoresist pattern 138a (in FIGS. 17D, 18D, 19D, and 20D) is removed. The active layer 140 exposed by the source and drain electrodes 142 and 146 may correspond to the half transmitting portion M12 (in FIG. 17B). In addition, the source and drain electrodes 142 and 146, the data line 148 (in FIG. 16), the ohmic contact layer 141, and the active layer 140 may be formed through a second mask process using the mask 200 (in FIGS. 17B, 18B, 19B, and 20B).

In FIGS. 17F, 18F, 19F, and 20F, a passivation layer 156 may be formed on the data line, the source and drain electrodes 142 and 146, and the second and fourth shorting bars 152 and 154 by coating a transparent organic material, such as benzocyclobutene (BCB) and an acrylic resin, or by depositing an inorganic material, such as silicon nitride (SiNx) and silicon oxide (SiO$_2$). Next, the passivation layer 156 may be patterned through a third mask process, thereby forming a first contact hole 158, a second contact hole 160, a third contact hole 162, a fourth contact hole 164 (in FIG. 14), a fifth contact hole 166, a sixth contact hole 168 (in FIG. 13A), a seventh contact hole 170, a eighth contact hole 172 (in FIG. 13A), and a ninth contact hole 174. The first contact hole 158 exposes a portion of the drain electrode 146, the second contact hole 160 exposes a portion of the gate pad 108, the third contact hole 162 exposes a portion of the data pad 150, the fourth contact hole 164 (in FIG. 14) exposes a portion of the second shorting bar 152, the fifth contact hole 166 exposes a portion of the third shorting bar 129, the sixth contact hole 168 (in FIG. 13A) exposes a portion of the second shorting bar 152, the seventh contact hole 170 exposes a portion of the fourth shorting bar 154, the eighth contact hole 172 (in FIG. 13A) exposes a portion of the second connecting line 122 (in FIG. 13A), and the ninth contact hole 174 exposes a portion of the fourth connecting line 126.

In FIGS. 17G, 18G, 19G, and 20G, a pixel electrode 176 may be formed on the passivation layer 156 by depositing a transparent conductive material, such as indium-tin-oxide (ITO) and indium-zinc-oxide (IZO), and patterning the transparent conductive material through a fourth mask process. The pixel electrode 176 may be connected to the drain electrode 146 via the first contact hole 158. At this time, a gate pad terminal 178, a data pad terminal 180, a first conducting pattern 182 (in FIG. 13A), and a second conducting pattern 184 are also formed of the transparent conductive material. The gate pad terminal 178 is connected to the gate pad 108 through the second contact hole 160. The gate pad terminal 178 may be connected to the second shorting bar 152 through the fourth contact hole 164 (in FIG. 14). The data pad terminal 180 is connected to the data pad 150 and the third shorting bar 129 through the third and fifth contact holes 162 and 166, respectively. The first conducting pattern 182 (in FIG. 13A) is connected to the second shorting bar 152 and the second connecting line 122 through the sixth contact hole 168 and the eighth contact hole 172, respectively. The second conducting pattern 184 is connected to the fourth shorting bar 154 and the fourth connection line 126 through the seventh contact hole 170 and the ninth contact hole 174, respectively.

Accordingly, the array substrate of the present invention may be manufactured by using four masks. In the present invention, the first to fourth connection lines 120, 122, 124, and 126, and the first and third shorting bars 128 and 129 may be formed of the same material as the gate electrode material, and the second and fourth shorting bars 152 and 154 may be formed of the same material as the source and drain electrodes material. The second and fourth shorting bars 152 and 154 may be connected to the second and fourth connection lines 122 and 126 using the first and second conducting patterns 182 and 184, respectively. Thus, there is no disconnection between the shorting bar and the connection line, even if the source and drain electrodes are made of molybdenum. Accordingly, fabricating time and costs are reduced, and productivity of the liquid crystal display device increases.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A manufacturing method of an array substrate for a liquid crystal display device, comprising:
   forming a plurality of gate lines, a plurality of gate electrodes, and a plurality of odd-numbered and even-numbered gate pads on a substrate;
   forming a gate insulating layer on the plurality of gate lines, the plurality of gate electrodes and the plurality of odd-numbered and even-numbered gate pads;
   forming a plurality of active layers on the gate insulating layer;
   forming a plurality of ohmic contact layers on the plurality of active layers;
   forming a plurality of data lines, a plurality of odd-numbered and even-numbered data pads, a plurality of source electrodes, and a plurality of drain electrodes on the plurality of ohmic contact layers;
   forming a first shorting bar electrically connected to each of the odd-numbered gate pads;
   forming a second shorting bar electrically connected to each of the even-numbered gate pads;
   forming a third shorting bar electrically connected to each of the odd-numbered data pads;
   forming a fourth shorting bar electrically connected to each of the even-numbered data pads;
   forming first, second, third, and fourth connection lines electrically connected to the first, second, third, and fourth shorting bars, respectively;
   forming first, second, third, and fourth test pads connected to the first, second, third, and fourth connection lines, respectively;
   forming a passivation layer on the plurality of data lines, the plurality of odd-numbered and even-numbered data pads, the plurality of source electrodes, and the plurality of drain electrodes; and
   forming a plurality of pixel electrodes on the passivation layer,
   wherein the steps of forming the first shorting bar, the third shorting bar, the first, second, third, and fourth connection lines, and the first, second, third, and fourth test pads arc simultaneously performed with the steps of forming the plurality of gate lines, the plurality of gate electrodes, and the plurality of odd-numbered and even-numbered gate pads, and
   wherein the steps of forming the second shorting bar and the fourth shorting bar are simultaneously performed with the step of forming the plurality of data lines, the plurality of odd-numbered and even-numbered data pads, the plurality of source electrodes, and the plurality of drain electrodes.

2. The method according to claim 1, wherein the step of forming the plurality of data lines, the plurality of odd-numbered and even-numbered data pads, the plurality of source electrodes, and the plurality of drain electrodes uses a dry etching method.

3. The method according to claim 2, wherein the plurality of data lines, the plurality of odd-numbered and even-numbered data pads, the plurality of source electrodes, and the plurality of dram electrodes include molybdenum.

4. The method according to claim 1, further comprising steps of forming a first conducting pattern electrically connecting the second shorting bar to the second connection line, and forming a second conducting pattern electrically connecting the fourth shorting bar to the fourth connection line.

5. The method, according to claim 4, wherein the steps of forming the first conducting pattern and the second conducting pattern are simultaneously performed with the step of forming the plurality of pixel electrodes.

6. The method according to claim 1, wherein the steps of forming the plurality of active layers, forming the plurality of ohmic contact layers, and forming the plurality of data lines, the plurality of odd-numbered and even-numbered data pads, the plurality of source electrodes, and the plurality of drain electrodes are accomplished through a photolithographic process.

7. The method according to claim 6, wherein the photolithographic process uses a mask that includes a transmitting portion, a blocking portion, and a half transmitting portion.

8. The method according to claim 7, wherein the photolithographic process includes a step of forming a photoresist pattern having a first thickness and a second thickness thinner than the first thickness.

9. The method according to claim 8, wherein the first thickness of the photoresist pattern corresponds to the blocking portion of the mask and the second thickness of the photoresist pattern corresponds to the half transmitting portion.

10. The method according to claim 8, wherein the photoresist pattern is a positive type material such that a portion of the material exposed to light is developed and removed.

11. The method according to claim 1, wherein each of the plurality of active layers has the same shape as each of the plurality of source electrodes and each of the plurality of drain electrodes except for a portion between each of the plurality of source electrodes and each of the plurality of drain electrodes.

12. The method according to claim 11, wherein each of the plurality of ohmic contact layers has the same shape as each of the plurality of source electrodes and each of the plurality of drain electrodes.

13. The method according to claim 1, wherein the step of forming the plurality of pixel electrodes includes a step of forming a plurality of gate pad terminals and a plurality of data pad terminals, the plurality of gate pad terminals contacting the plurality of odd-numbered and even-numbered gate pads, the plurality of data pad terminals contacting the plurality of odd-numbered and even-numbered data pads.

14. The method according to claim 1, wherein the plurality of gate lines, the plurality of gate electrodes, and the plurality of odd-numbered and even-numbered gate pads include a double layer structure having a first layer and a second layer.

15. The method according to claim 14, wherein the first layer includes aluminum, and the second layer includes one of chromium and molybdenum.

* * * * *